United States Patent
Fountain, Jr. et al.

(10) Patent No.: US 12,456,662 B2
(45) Date of Patent: Oct. 28, 2025

(54) STRUCTURES WITH THROUGH-SUBSTRATE VIAS AND METHODS FOR FORMING THE SAME

(71) Applicant: ADEIA SEMICONDUCTOR BONDING TECHNOLOGIES INC., San Jose, CA (US)

(72) Inventors: Gaius Gillman Fountain, Jr., Youngsville, NC (US); Cyprian Emeka Uzoh, San Jose, CA (US); George Carlton Hudson, San Jose, CA (US); John Posthill, San Jose, CA (US)

(73) Assignee: ADEIA Semiconductor Bonding Technologies Inc., San Jose, CA (US)

( * ) Notice: Subject to any disclaimer, the term of this patent is extended or adjusted under 35 U.S.C. 154(b) by 241 days.

(21) Appl. No.: 17/646,135

(22) Filed: Dec. 27, 2021

(65) Prior Publication Data

US 2022/0246497 A1    Aug. 4, 2022

Related U.S. Application Data

(60) Provisional application No. 63/216,389, filed on Jun. 29, 2021, provisional application No. 63/131,263, filed on Dec. 28, 2020.

(51) Int. Cl.
*H01L 23/48* (2006.01)
*H01L 23/00* (2006.01)
(Continued)

(52) U.S. Cl.
CPC ...... *H01L 23/481* (2013.01); *H01L 23/53238* (2013.01); *H01L 24/08* (2013.01); *H01L 2224/08146* (2013.01)

(58) Field of Classification Search
CPC . H01L 23/481; H01L 23/53238; H01L 24/08; H01L 2224/08146; H01L 23/5226;
(Continued)

(56) References Cited

U.S. PATENT DOCUMENTS

| 4,612,083 A | 9/1986 | Yasumoto et al. |
| 4,818,728 A | 4/1989 | Rai et al. |

(Continued)

FOREIGN PATENT DOCUMENTS

| CN | 105140144 A | 12/2015 |
| CN | 106653720 A | 5/2017 |

(Continued)

OTHER PUBLICATIONS

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

(Continued)

*Primary Examiner* — Niki H Nguyen
(74) *Attorney, Agent, or Firm* — Knobbe, Martens, Olson & Bear, LLP

(57) ABSTRACT

A microelectronic structure with through substrate vias (TSVs) and method for forming the same is disclosed. The microelectronic structure can include a bulk semiconductor with a via structure. The via structure can have a first and second conductive portion. The via structure can also have a barrier layer between the first conductive portion and the bulk semiconductor. The structure can have a second barrier layer between the first and second conductive portions. The second conductive portion can extend from the second barrier layer to the upper surface of the bulk semiconductor.

(Continued)

The microelectronic structure containing TSVs is configured so that the microelectronic structure can be bonded to a second element or structure.

33 Claims, 15 Drawing Sheets

(51) Int. Cl.
*H01L 23/52* (2006.01)
*H01L 23/532* (2006.01)
*H01L 29/40* (2006.01)

(58) Field of Classification Search
CPC ..... H01L 21/76898; H01L 2924/00014; H01L 2924/15311; H01L 23/49827; H01L 25/50; H01L 21/76877; H01L 2224/0401; H01L 2224/16225; H01L 24/16; H01L 24/13; H01L 2224/48091; H01L 23/49816; H01L 2924/181; H01L 23/528; H01L 23/5389; H01L 2224/04105; H01L 21/76897; H01L 2224/73265; H01L 21/76802; H01L 23/5283; H01L 24/19; H01L 2924/01029; H01L 2224/16227; H01L 2224/73204; H01L 2225/06541; H01L 21/76816; H01L 23/49822; H01L 24/32; H01L 2224/48227; H01L 2924/14; H01L 23/3128; H01L 23/5384; H01L 23/5386; H01L 2924/014
See application file for complete search history.

(56) References Cited

U.S. PATENT DOCUMENTS

| | | | |
|---|---|---|---|
| 4,904,328 A | 2/1990 | Beecher et al. |
| 4,939,568 A | 7/1990 | Kato et al. |
| 4,998,665 A | 3/1991 | Hayashi |
| 5,087,585 A | 2/1992 | Hayashi |
| 5,236,118 A | 8/1993 | Bower et al. |
| 5,322,593 A | 6/1994 | Hasegawa et al. |
| 5,413,952 A | 5/1995 | Pages et al. |
| 5,419,806 A | 5/1995 | Huebner |
| 5,442,235 A | 8/1995 | Parrillo et al. |
| 5,489,804 A | 2/1996 | Pasch |
| 5,501,003 A | 3/1996 | Bernstein |
| 5,503,704 A | 4/1996 | Bower et al. |
| 5,504,376 A | 4/1996 | Sugahara et al. |
| 5,516,727 A | 5/1996 | Broom |
| 5,563,084 A | 10/1996 | Ramm et al. |
| 5,610,431 A | 3/1997 | Martin |
| 5,696,406 A | 12/1997 | Ueno |
| 5,734,199 A | 3/1998 | Kawakita et al. |
| 5,753,536 A | 5/1998 | Sugiyama et al. |
| 5,771,555 A | 6/1998 | Eda et al. |
| 5,821,692 A | 10/1998 | Rogers et al. |
| 5,866,942 A | 2/1999 | Suzuki et al. |
| 5,985,739 A | 11/1999 | Plettner et al. |
| 5,998,808 A | 12/1999 | Matsushita |
| 6,008,126 A | 12/1999 | Leedy |
| 6,054,363 A | 4/2000 | Sakaguchi et al. |
| 6,063,968 A | 5/2000 | Hubner et al. |
| 6,071,761 A | 6/2000 | Jacobs |
| 6,080,640 A | 6/2000 | Gardner et al. |
| 6,097,096 A | 8/2000 | Gardner et al. |
| 6,123,825 A | 9/2000 | Uzoh et al. |
| 6,147,000 A | 11/2000 | You et al. |
| 6,183,592 B1 | 2/2001 | Sylvester |
| 6,218,203 B1 | 4/2001 | Khoury et al. |
| 6,232,150 B1 | 5/2001 | Lin et al. |
| 6,258,625 B1 | 7/2001 | Brofman et al. |
| 6,259,160 B1 | 7/2001 | Lopatin et al. |
| 6,265,775 B1 | 7/2001 | Seyyedy |
| 6,297,072 B1 | 10/2001 | Tilmans et al. |
| 6,316,786 B1 | 11/2001 | Mueller et al. |
| 6,322,600 B1 | 11/2001 | Brewer et al. |
| 6,333,120 B1 | 12/2001 | DeHaven et al. |
| 6,333,206 B1 | 12/2001 | Ito et al. |
| 6,348,709 B1 | 2/2002 | Graettinger et al. |
| 6,359,235 B1 | 3/2002 | Hayashi |
| 6,374,770 B1 | 4/2002 | Lee |
| 6,409,904 B1 | 6/2002 | Uzoh et al. |
| 6,423,640 B1 | 7/2002 | Lee et al. |
| 6,465,892 B1 | 10/2002 | Suga |
| 6,515,343 B1 | 2/2003 | Shroff et al. |
| 6,528,894 B1 | 3/2003 | Akram et al. |
| 6,552,436 B2 | 4/2003 | Burnette et al. |
| 6,555,917 B1 | 4/2003 | Heo |
| 6,579,744 B1 | 6/2003 | Jiang |
| 6,583,515 B1 | 6/2003 | James et al. |
| 6,589,813 B1 | 7/2003 | Park |
| 6,593,645 B2 | 7/2003 | Shih et al. |
| 6,600,224 B1 | 7/2003 | Farquhar et al. |
| 6,624,003 B1 | 9/2003 | Rice |
| 6,627,814 B1 | 9/2003 | Stark |
| 6,632,377 B1 | 10/2003 | Brusic et al. |
| 6,642,081 B1 | 11/2003 | Patti |
| 6,656,826 B2 | 12/2003 | Ishimaru |
| 6,660,564 B2 | 12/2003 | Brady |
| 6,667,225 B2 | 12/2003 | Hau-Riege et al. |
| 6,720,212 B2 | 4/2004 | Robl et al. |
| 6,759,738 B1 | 7/2004 | Fallon et al. |
| 6,828,686 B2 | 12/2004 | Park |
| 6,837,979 B2 | 1/2005 | Uzoh et al. |
| 6,847,527 B2 | 1/2005 | Sylvester et al. |
| 6,864,585 B2 | 3/2005 | Enquist |
| 6,867,073 B1 | 3/2005 | Enquist |
| 6,887,769 B2 | 5/2005 | Kellar et al. |
| 6,902,987 B1 | 6/2005 | Tong et al. |
| 6,908,027 B2 | 6/2005 | Tolchinsky et al. |
| 6,909,194 B2 | 6/2005 | Farnworth et al. |
| 6,960,492 B1 | 11/2005 | Miyamoto |
| 6,962,835 B2 | 11/2005 | Tong et al. |
| 6,974,769 B2 | 12/2005 | Basol et al. |
| 7,037,755 B2 | 5/2006 | Enquist |
| 7,045,453 B2 | 5/2006 | Canaperi et al. |
| 7,078,811 B2 | 7/2006 | Suga |
| 7,105,980 B2 | 9/2006 | Abbott et al. |
| 7,109,063 B2 | 9/2006 | Jiang |
| 7,109,092 B2 | 9/2006 | Tong |
| 7,126,212 B2 | 10/2006 | Enquist et al. |
| 7,193,239 B2 | 3/2007 | Leedy |
| 7,193,423 B1 | 3/2007 | Dalton et al. |
| 7,247,948 B2 | 7/2007 | Hedler et al. |
| 7,335,572 B2 | 2/2008 | Tong et al. |
| 7,354,798 B2 | 4/2008 | Pogge et al. |
| 7,387,944 B2 | 6/2008 | Tong et al. |
| 7,473,633 B2 | 1/2009 | Furukawa et al. |
| 7,485,968 B2 | 2/2009 | Enquist et al. |
| 7,553,744 B2 | 6/2009 | Tong et al. |
| 7,750,488 B2 * | 7/2010 | Patti .................. H01L 25/0657 257/782 |
| 7,772,123 B2 | 8/2010 | Birner et al. |
| 7,803,693 B2 | 9/2010 | Trezza |
| 7,807,549 B2 | 10/2010 | Tong et al. |
| 7,998,335 B2 | 8/2011 | Feeney et al. |
| 8,183,127 B2 | 5/2012 | Patti et al. |
| 8,241,961 B2 | 8/2012 | Kim et al. |
| 8,314,007 B2 | 11/2012 | Vaufredaz |
| 8,349,635 B1 | 1/2013 | Gan et al. |
| 8,357,931 B2 | 1/2013 | Schieck et al. |
| 8,377,798 B2 | 2/2013 | Peng et al. |
| 8,435,421 B2 | 5/2013 | Keleher et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,531,000 B2 | 9/2013 | Yoneda |
| 8,620,164 B2 | 12/2013 | Heck et al. |
| 8,647,987 B2 | 2/2014 | Yang et al. |
| 8,697,493 B2 | 4/2014 | Sadaka |

(56) References Cited

U.S. PATENT DOCUMENTS

| | | |
|---|---|---|
| 8,716,105 B2 | 5/2014 | Sadaka et al. |
| 8,716,134 B2 | 5/2014 | Edelstein et al. |
| 8,772,155 B2 | 7/2014 | Haimson et al. |
| 8,796,135 B2 | 8/2014 | Oganesian et al. |
| 8,802,538 B1 | 8/2014 | Liu |
| 8,809,123 B2 | 8/2014 | Liu et al. |
| 8,841,002 B2 | 9/2014 | Tong |
| 8,847,380 B2 | 9/2014 | Oganesian et al. |
| 8,916,448 B2 | 12/2014 | Cheng et al. |
| 8,988,299 B2 | 3/2015 | Kam et al. |
| 9,000,600 B2 | 4/2015 | Uzoh et al. |
| 9,040,385 B2 | 5/2015 | Chen et al. |
| 9,064,937 B2 | 6/2015 | Edelstein et al. |
| 9,076,785 B2 | 7/2015 | Uzoh |
| 9,082,627 B2 | 7/2015 | Tong et al. |
| 9,093,350 B2 | 7/2015 | Endo et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,331,032 B2 | 5/2016 | Liu et al. |
| 9,331,149 B2 | 5/2016 | Tong et al. |
| 9,337,235 B2 | 5/2016 | Chen et al. |
| 9,343,330 B2 | 5/2016 | Brusic et al. |
| 9,343,369 B2 | 5/2016 | Du et al. |
| 9,349,669 B2 | 5/2016 | Uzoh et al. |
| 9,362,203 B2 | 6/2016 | Oganesian et al. |
| 9,368,866 B2 | 6/2016 | Yu |
| 9,385,024 B2 | 7/2016 | Tong et al. |
| 9,391,143 B2 | 7/2016 | Tong et al. |
| 9,394,161 B2 | 7/2016 | Cheng et al. |
| 9,425,155 B2 | 8/2016 | Liu et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,154 B2 | 11/2016 | Tosaya et al. |
| 9,496,218 B2 * | 11/2016 | Lee .................. H01L 21/76898 |
| 9,496,239 B1 | 11/2016 | Edelstein et al. |
| 9,536,848 B2 | 1/2017 | England et al. |
| 9,559,081 B1 | 1/2017 | Lai et al. |
| 9,607,928 B2 | 3/2017 | Uzoh |
| 9,620,481 B2 | 4/2017 | Edelstein et al. |
| 9,656,852 B2 | 5/2017 | Cheng et al. |
| 9,679,867 B2 | 6/2017 | Ashidate et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,847,277 B2 | 12/2017 | Oganesian et al. |
| 9,852,988 B2 | 12/2017 | Enquist et al. |
| 9,859,254 B1 | 1/2018 | Yu et al. |
| 9,865,581 B2 | 1/2018 | Jang et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,129 B2 | 5/2018 | Liu et al. |
| 9,960,142 B2 | 5/2018 | Chen et al. |
| 10,002,844 B1 | 6/2018 | Wang et al. |
| 10,026,605 B2 | 7/2018 | Doub et al. |
| 10,074,594 B2 * | 9/2018 | Fang .................... H01L 23/481 |
| 10,075,657 B2 | 9/2018 | Fahim et al. |
| 10,103,122 B2 | 10/2018 | Liu et al. |
| 10,147,641 B2 | 12/2018 | Enquist et al. |
| 10,163,757 B2 | 12/2018 | Uzoh |
| 10,204,893 B2 | 2/2019 | Uzoh et al. |
| 10,211,166 B2 | 2/2019 | Matsuo |
| 10,269,708 B2 | 4/2019 | Enquist et al. |
| 10,269,756 B2 | 4/2019 | Uzoh |
| 10,276,619 B2 | 4/2019 | Kao et al. |
| 10,276,909 B2 | 4/2019 | Huang et al. |
| 10,312,275 B2 | 6/2019 | Hynecek |
| 10,354,942 B2 | 7/2019 | Oganesian et al. |
| 10,418,277 B2 | 9/2019 | Cheng et al. |
| 10,431,614 B2 | 10/2019 | Gambino et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,522,499 B2 | 12/2019 | Enquist et al. |
| 10,707,087 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,937,755 B2 | 3/2021 | Shah et al. |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,088,099 B2 | 8/2021 | Katkar et al. |
| 11,127,738 B2 | 9/2021 | DeLaCruz et al. |
| 11,158,573 B2 | 10/2021 | Uzoh et al. |
| 11,158,606 B2 | 10/2021 | Gao et al. |
| 11,169,326 B2 | 11/2021 | Huang et al. |
| 11,171,117 B2 | 11/2021 | Gao et al. |
| 11,176,450 B2 | 11/2021 | Teig et al. |
| 11,195,748 B2 | 12/2021 | Uzoh et al. |
| 11,205,625 B2 | 12/2021 | DeLaCruz et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,367,652 B2 | 6/2022 | Uzoh et al. |
| 11,380,597 B2 | 7/2022 | Katkar et al. |
| 11,385,278 B2 | 7/2022 | DeLaCruz et al. |
| 11,387,202 B2 | 7/2022 | Haba et al. |
| 11,387,214 B2 | 7/2022 | Wang et al. |
| 11,393,779 B2 | 7/2022 | Gao et al. |
| 11,462,419 B2 | 10/2022 | Haba |
| 11,476,213 B2 | 10/2022 | Haba et al. |
| 11,515,291 B2 | 11/2022 | DeLaCruz et al. |
| 11,756,880 B2 | 9/2023 | Uzoh et al. |
| 12,125,784 B2 | 10/2024 | Uzoh et al. |
| 2002/0000328 A1 | 1/2002 | Motomura et al. |
| 2002/0003307 A1 | 1/2002 | Suga |
| 2002/0025665 A1 | 2/2002 | Juengling |
| 2002/0074670 A1 | 6/2002 | Suga |
| 2002/0094661 A1 | 7/2002 | Enquist et al. |
| 2002/0113241 A1 | 8/2002 | Kubota et al. |
| 2003/0092220 A1 | 5/2003 | Akram |
| 2003/0109083 A1 | 6/2003 | Ahmad |
| 2003/0129796 A1 | 7/2003 | Bruchhaus et al. |
| 2003/0157748 A1 | 8/2003 | Kim et al. |
| 2003/0193076 A1 * | 10/2003 | Patti ....................... H01L 25/50 |
| | | 257/E21.597 |
| 2004/0084414 A1 | 5/2004 | Sakai et al. |
| 2004/0157407 A1 | 8/2004 | Tong et al. |
| 2004/0217483 A1 | 11/2004 | Hedler et al. |

(56) References Cited

U.S. PATENT DOCUMENTS

| | | |
|---|---|---|
| 2004/0262772 A1 | 12/2004 | Ramanathan et al. |
| 2005/0104224 A1 | 5/2005 | Huang et al. |
| 2005/0181542 A1 | 8/2005 | Enquist |
| 2006/0024950 A1 | 2/2006 | Choi et al. |
| 2006/0057945 A1 | 3/2006 | Hsu et al. |
| 2007/0096294 A1 | 5/2007 | Ikeda et al. |
| 2007/0111386 A1 | 5/2007 | Kim et al. |
| 2007/0212870 A1 | 9/2007 | Yang et al. |
| 2007/0222048 A1 | 9/2007 | Huang |
| 2007/0295456 A1 | 12/2007 | Gudeman et al. |
| 2007/0296073 A1 | 12/2007 | Wu et al. |
| 2008/0081433 A1 | 4/2008 | Koh et al. |
| 2008/0122092 A1 | 5/2008 | Hong |
| 2008/0164573 A1 | 7/2008 | Basker et al. |
| 2009/0197408 A1 | 8/2009 | Lehr et al. |
| 2009/0200668 A1 | 8/2009 | Yang et al. |
| 2010/0164066 A1 | 7/2010 | Di Franco |
| 2011/0074040 A1 | 3/2011 | Frank et al. |
| 2011/0084400 A1 | 4/2011 | Fujii |
| 2011/0097853 A1* | 4/2011 | Kim ............... H01L 25/50 438/653 |
| 2011/0193199 A1* | 8/2011 | Filippi ............ H01L 25/0657 438/106 |
| 2011/0290552 A1 | 12/2011 | Palmateer et al. |
| 2012/0133010 A1 | 5/2012 | Komukai |
| 2012/0153492 A1 | 6/2012 | Bachman et al. |
| 2012/0211894 A1 | 8/2012 | Aoyagi |
| 2012/0212384 A1 | 8/2012 | Kam et al. |
| 2012/0319280 A1 | 12/2012 | Suganuma et al. |
| 2013/0020704 A1 | 1/2013 | Sadaka |
| 2013/0075900 A1 | 3/2013 | Shim et al. |
| 2013/0093092 A1 | 4/2013 | Kanki et al. |
| 2013/0105968 A1* | 5/2013 | Lu ..................... H01L 24/05 257/737 |
| 2013/0119543 A1 | 5/2013 | Yu et al. |
| 2013/0119547 A1 | 5/2013 | Kim et al. |
| 2013/0221527 A1 | 8/2013 | Yang et al. |
| 2013/0249098 A1 | 9/2013 | West |
| 2013/0256913 A1 | 10/2013 | Black et al. |
| 2013/0320556 A1 | 12/2013 | Liu et al. |
| 2013/0328186 A1 | 12/2013 | Uzoh et al. |
| 2014/0084481 A1 | 3/2014 | Zhang et al. |
| 2014/0117546 A1 | 5/2014 | Liu et al. |
| 2014/0131869 A1 | 5/2014 | Pendse |
| 2014/0175655 A1 | 6/2014 | Chen et al. |
| 2014/0191414 A1 | 7/2014 | Kim |
| 2014/0225795 A1 | 8/2014 | Yu |
| 2014/0252635 A1 | 9/2014 | Tran et al. |
| 2014/0264948 A1 | 9/2014 | Chou et al. |
| 2014/0332980 A1 | 11/2014 | Sanders et al. |
| 2015/0028476 A1 | 1/2015 | Kirby et al. |
| 2015/0048496 A1 | 2/2015 | Chiu et al. |
| 2015/0064498 A1 | 3/2015 | Tong |
| 2015/0108644 A1 | 4/2015 | Kuang et al. |
| 2015/0155263 A1 | 6/2015 | Farooq et al. |
| 2015/0206823 A1 | 7/2015 | Lin et al. |
| 2015/0214191 A1 | 7/2015 | Lee et al. |
| 2015/0228621 A1 | 8/2015 | Kumar et al. |
| 2015/0262839 A1 | 9/2015 | Kim et al. |
| 2015/0279798 A1 | 10/2015 | Park |
| 2015/0311141 A1 | 10/2015 | Wu et al. |
| 2016/0049371 A1 | 2/2016 | Lee et al. |
| 2016/0086923 A1 | 3/2016 | Best |
| 2016/0148874 A1 | 5/2016 | Peng et al. |
| 2016/0204002 A1 | 7/2016 | Wallace et al. |
| 2016/0343682 A1 | 11/2016 | Kawasaki |
| 2017/0053897 A1 | 2/2017 | Lai et al. |
| 2017/0062366 A1 | 3/2017 | Enquist |
| 2017/0162440 A1 | 6/2017 | Lu et al. |
| 2017/0179029 A1 | 6/2017 | Enquist et al. |
| 2017/0194271 A1 | 7/2017 | Hsu et al. |
| 2017/0358551 A1 | 12/2017 | Liu et al. |
| 2018/0175012 A1 | 6/2018 | Wu et al. |
| 2018/0182639 A1 | 6/2018 | Uzoh et al. |
| 2018/0182665 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0204798 A1 | 7/2018 | Enquist et al. |
| 2018/0219038 A1 | 8/2018 | Gambino et al. |
| 2018/0226371 A1 | 8/2018 | Enquist |
| 2018/0273377 A1 | 9/2018 | Katkar et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0019743 A1 | 1/2019 | Fang et al. |
| 2019/0057756 A1 | 2/2019 | Kim et al. |
| 2019/0088535 A1 | 3/2019 | Yan et al. |
| 2019/0109042 A1 | 4/2019 | Katkar et al. |
| 2019/0115277 A1 | 4/2019 | Yu et al. |
| 2019/0131277 A1 | 5/2019 | Yang et al. |
| 2019/0157334 A1 | 5/2019 | Wei et al. |
| 2019/0164939 A1 | 5/2019 | Yang |
| 2019/0189603 A1 | 6/2019 | Wang et al. |
| 2019/0333550 A1 | 10/2019 | Fisch |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035630 A1 | 1/2020 | Kameshima |
| 2020/0035641 A1 | 1/2020 | Fountain, Jr. et al. |
| 2020/0227367 A1 | 7/2020 | Haba et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0134748 A1* | 5/2021 | Liu ..................... H01L 25/50 |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0351112 A1 | 11/2021 | Park et al. |
| 2021/0358767 A1 | 11/2021 | Tanaka et al. |
| 2021/0366820 A1 | 11/2021 | Uzoh |
| 2021/0391302 A1* | 12/2021 | Kao ................ H01L 21/76898 |
| 2021/0407941 A1 | 12/2021 | Haba |
| 2022/0013456 A1 | 1/2022 | Uzoh et al. |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0129594 A1 | 4/2023 | Sharangpani et al. |
| 2023/0130259 A1 | 4/2023 | Haba et al. |
| 2023/0132632 A1 | 5/2023 | Katkar et al. |
| 2023/0139612 A1 | 5/2023 | Kim et al. |
| 2023/0140107 A1 | 5/2023 | Uzoh et al. |
| 2023/0142680 A1 | 5/2023 | Guevara et al. |

(56) References Cited

U.S. PATENT DOCUMENTS

| | | |
|---|---|---|
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |
| 2024/0047344 A1 | 2/2024 | Uzoh et al. |
| 2024/0055407 A1 | 2/2024 | Workman |
| 2024/0079376 A1 | 3/2024 | Suwito et al. |
| 2024/0105674 A1 | 3/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |
| 2024/0379539 A1 | 11/2024 | Uzoh et al. |
| 2024/0387419 A1 | 11/2024 | Mrozek et al. |
| 2025/0004197 A1 | 1/2025 | Haba et al. |
| 2025/0006632 A1 | 1/2025 | Chang et al. |
| 2025/0006642 A1 | 1/2025 | Haba et al. |
| 2025/0006674 A1 | 1/2025 | Uzoh et al. |
| 2025/0006679 A1 | 1/2025 | Theil et al. |
| 2025/0006689 A1 | 1/2025 | Uzoh et al. |
| 2025/0054854 A1 | 2/2025 | Katkar et al. |
| 2025/0079364 A1 | 3/2025 | Uzoh et al. |
| 2025/0096191 A1 | 3/2025 | Gao et al. |
| 2025/0112123 A1 | 4/2025 | Katkar et al. |
| 2025/0185163 A1 | 6/2025 | Zhao et al. |

FOREIGN PATENT DOCUMENTS

| | | | |
|---|---|---|---|
| CN | 106920795 A | 7/2017 | |
| CN | 107731668 A | 2/2018 | |
| CN | 107993927 A | 5/2018 | |
| CN | 107993928 A | 5/2018 | |
| CN | 109155301 A | 1/2019 | |
| CN | 109411443 A | 3/2019 | |
| CN | 109417073 A | 3/2019 | |
| CN | 109417075 A | 3/2019 | |
| CN | 109417077 A | 3/2019 | |
| CN | 109643643 A | 4/2019 | |
| CN | 109844915 A | 6/2019 | |
| CN | 113097129 A | 7/2021 | |
| EP | 0 465 227 A2 | 1/1992 | |
| EP | 2408006 A2 * | 1/2012 | ....... H01L 21/76898 |
| EP | 2 863 420 A1 | 4/2015 | |
| JP | 61-030059 | 2/1986 | |
| JP | 01-168040 | 7/1989 | |
| JP | 4-259249 | 9/1992 | |
| JP | 05-029183 | 2/1993 | |
| JP | 5-198739 | 8/1993 | |
| JP | 6-13456 | 1/1994 | |
| JP | 6-260594 | 9/1994 | |
| JP | H07-66093 | 3/1995 | |
| JP | H7-249749 | 9/1995 | |
| JP | 7-283382 | 10/1995 | |
| JP | 8-78645 | 3/1996 | |
| JP | 8-125121 | 5/1996 | |
| JP | 8-186235 | 7/1996 | |
| JP | 9-120979 | 5/1997 | |
| JP | 10-135404 | 5/1998 | |
| JP | 10-223636 | 8/1998 | |
| JP | 10-242383 | 9/1998 | |
| JP | 11-186120 | 7/1999 | |
| JP | 2000-100679 | 4/2000 | |
| JP | 2000-260934 | 9/2000 | |
| JP | 2000-299379 | 10/2000 | |
| JP | 2000-311982 | 11/2000 | |
| JP | 2001-102479 | 4/2001 | |
| JP | 2001-326326 | 11/2001 | |
| JP | 2002-026123 | 1/2002 | |
| JP | 2002-516033 | 5/2002 | |
| JP | 2002-353416 | 12/2002 | |
| JP | 2002-368159 | 12/2002 | |
| JP | 2003-023071 | 1/2003 | |
| JP | 2004-200547 | 7/2004 | |
| JP | 2005-038942 A | 2/2005 | |
| JP | 2005-086089 | 3/2005 | |
| JP | 2005-093486 | 4/2005 | |
| JP | 2005-093954 A | 4/2005 | |
| JP | 2005-135988 | 5/2005 | |
| JP | 2013-033786 A | 2/2013 | |
| JP | 2013-033900 A | 2/2013 | |
| JP | 2018-160519 | 10/2018 | |
| JP | 2019-129199 | 8/2019 | |
| KR | 10-2012-0106366 | 9/2012 | |
| KR | 10-2015-0097798 | 8/2015 | |
| TW | 442909 | 6/2001 | |
| TW | 476145 | 2/2002 | |
| TW | 201318085 A | 5/2013 | |
| WO | WO 01/61743 A1 | 8/2001 | |
| WO | WO 03/054954 A2 | 7/2003 | |
| WO | WO 2005/043584 A2 | 5/2005 | |
| WO | WO 2006/100444 A1 | 9/2006 | |
| WO | WO 2012/013162 A1 | 2/2012 | |
| WO | WO 2016/185883 A1 | 11/2016 | |
| WO | WO 2017/151442 A1 | 9/2017 | |
| WO | WO 2017/155002 A1 | 9/2017 | |
| WO | WO 2019/146427 A1 | 8/2019 | |

OTHER PUBLICATIONS

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

ONSEMI AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "ONSEMI AR0820.".

Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in

(56) References Cited

OTHER PUBLICATIONS

Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "SONY IMX260 image."
Amirfeiz et al., "Formation of silicon structures by plasma-activated wafer bonding," Journal of The Electrochemical Society, 2000, vol. 147, No. 7, pp. 2693-2698.
Appeal Decision of Rejection issued on Apr. 12, 2016 in Japanese Patent Application No. 2008-526104, in 14 pages.
Aspar, B. et al., "The smart-cut process: Status and developments," Proc. Electrochem Soc., 1999, vol. 99-53, pp. 48-59.
Bower, R. et al., "Low temperature Si3N4 direct bonding," Appl. Phys. Lett., Jun. 28, 1993, vol. 62, No. 26, pp. 3485-3487.
Canadian Office Action issued Aug. 1, 2013 in Canadian Patent Application No. 2,618,191, 4 pages.
Canadian Office Action, mailed May 16, 2012 for Canadian Patent Application No. 2,515,375, with international preliminary report, 2 pages.
Ceramic Microstructures: Control at the Atomic Level, Recent Progress in Surface Activated Bonding, 1998, pp. 385-389.
"Chemical Mechanical Polishing (CMP) Metrology with Advanced Surface Polisher," Park Systems, 4 pages.
Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.
Chung et al., "Wafer direct bonding of compound semiconductors and silicon at room temperature by the surface activated bonding method," Applied Surface Science, Jun. 2, 1997, vols. 117-118, pp. 808-812.
D'Agostino, R., "Plasma etching of Si and SiO2 in SF6—O2 mixtures," J. Appl. Phys., Jan. 1981, vol. 52, No. 1, pp. 162-167.
Decision—Request for Trail Granted, Inter Partes Review, U.S. Pat. No. 7,485,968, Case IPR2013-00381, dated Dec. 18, 2013, in 27 pages.
Declaration of Richard A. Blanchard in Support of Petition for inter partes review of U.S. Pat. No. 7,485,968, dated Jun. 13, 2013, pp. 1-18.
Dysard, Jeffrey M. et al., "CMP solutions for the integration of high-k metal gate technologies," ECS Transactions, 2010, vol. 33, Issue 10, pp. 77-89.
Fan et al., "Copper wafer bonding," Electrochem. Solid-State Lett., U.S.A., The Electrochemical Society, Aug. 6, 1999, vol. 2, No. 10, pp. 534-536.
Fang, S.J. et al., "Advanced process control in dielectric chemical mechanical polishing (CMP)," Texas Instruments, Silicon Technology Development, 8 pages.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Final Written Decision, Inter PartesReview, U.S. Pat. No. 7,485,968, Case IPR2013-00381, dated Feb. 27, 2014, in 3 pages.
Gösele et al., "Semiconductor Wafer Bonding: A flexible approach to materials combinations in microelectronics; micromechanics and optoelectronics," IEEE, 1997, pp. 23-32.
Gösele et al., "Silicon layer transfer by wafer bonding," Proceedings of the Second International Symposium on Semiconductor Wafer Bonding: Science, Technology and Applications, The Electrochemical Society Proceedings, vol. 93-29 (1993), pp. 395-409.
Handbook of Thin Film Technology, Maissel and Glang, 1983 Reissue, pp. 12-24.

Harendt, C. et al., "Vertical polysilicon interconnects by aligned wafer bonding," Electrochemical Society Proceedings, 1998, vol. 97-36, pp. 501-508.
Hayashi, Y. et al., "Fabrication of three-dimensional IC using cumulatively bonded IC (CUBIC) technology," VSLI Tech. Dog., 1990, pp. 95-96.
Hizukuri, M. et al., "Dynamic strain and chip damage during ultrasonic flip chip bonding," Jpn. J. Appl. Phys. 40, 2001, pp. 3044-3048.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs—Si and InP—Si wafer direct bonding by the surface activated bonding method," Nuclear Inst. And Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7.
Howlader et al., "Bonding of p-Si/n-InP wafers through surface activated bonding method at room temperature," Indium Phosphide and Related Materials, 2001, IEEE International Conference On, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
"Hybrid Bonding—Patent Landscape Analysis," from Technologies to IP Business Intelligence, KnowMade Patent & Technology Intelligence, www.kmowmade.com, Nov. 2019, 81 pages.
Hymes, S. et al., "Determination of the planarization distance for copper CMP process," 6 pages.
Iida, A. et al., "The study of initial mechanism for Al—Au solid phase diffusion flip-chip bonding," Jpn. J. Appl. Phys. 40, 1997, pp. 3044-3661.
International Search Report and Written Opinion mailed Apr. 22, 2019 in International Application No. PCT/US2018/064982, 13 pages.
International Search Report and Written Opinion mailed Mar. 7, 2019, in International Application No. PCT/US2018/060044, 14 pages.
International Search Report and Written Opinion mailed Apr. 21, 2022, in International Application No. PCT/US2021/073122, 17 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Juang, Jing-Ye et al., "Copper-to-copper direct bonding on highly (111)-oriented nanotwinned copper in no-vacuum ambient," Scientific Reports, Sep. 17, 2018, vol. 8, 11 pages.
Ker, Ming-Dou et al., "Fully process-compatible layout design on bond pad to improve wire bond reliability in CMOS lcs," IEEE Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.

(56) References Cited

OTHER PUBLICATIONS

Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—CU, Cu—Si, and Cu—SiO2 at low temperature," Proceedings—Electrochemical Society, 2003, vol. 19, pp. 239-247.
Kissinger, G. et al., "Void-free silicon-wafer-bond stregthening in the 200-400 C range," Sensors and Actuators A, 1993, vol. 36, pp. 149-156.
Krauter, G. et al., "Low temperature silicon direct bonding for application in micromechanics: bonding energies for different combinations of oxides," Sensors and Actuators A, 1998, vol. 70, pp. 271-275.
Kunio, Takemitsu, "Three dimensional IC technology, using cubic method," Journal of the JWS, Japan Welding Society, Apr. 5, 1994, vol. 63, No. 3, pp. 185-189.
Lee, D. et al., "Slurry components in metal chemical mechanical planarization (CMP) process: A review," International Journal of Precision Engineering and Manufacturing, Dec. 2016, vol. 17, No. 12, pp. 1751-1762.
Li, Yuzhuo, "Key factors that influence step height reduction efficiency and defectivity during metal CMP," Clarkson University, Levitronix CMP Users' Conference 2006, 2006, 32 pages.
Li, Y.A. et al., "Low temperature copper to copper direct bonding," Jpn. Appl. Phys. 37, 1998, pp. L1068-L1069.
Li, Y.A. et al., "Systematic low temperature silicon bonding using pressure and temperature," Jpn. J. Appl. Phys., vol. 37, 1998, pp. 737-741.
Liu, Zi-Yu et al. "Detection and formation mechanism of microdefects in ultrafine pitch Cu—Cu direct bonding," Chin. Phys. B, 2016, vol. 25, No. 1, pp. 018103-1-018103-7.
Liu, C. et al., "Low-temperature direct copper-to-copper bonding enabled by creep on (111) surfaces of nanotwinned Cu," Scientific Reports, May 12, 2015, 5:09734, pp. 1-11.
Lu, L. et al., "Grain growth and strain release in nanocrystalline copper," Journal of Applied Physics, vol. 89, Issue 11, pp. 6408.
Luo, Ying, "Slurry Chemistry Effects On Copper Chemical Mechanical Planarization," University of Central Florida STARS, Electronic Theses and Disserations, 2004, Paper 36, 111 pages.
Matsuzawa et al., "Room-temperature interconnection of electroplated Au microbump by means of surface activated bonding method," Electornic Components and Technology Confererence, 2001, 51st Proceedings, IEEE, pp. 384-387.
Monsma et al., "Development of the spin-valve transistor," IEEE Tran. Magnet., vol. 33, No. 5, Sep. 1997, pp. 3495-3499.
Moriceau, H. et al., "Overview of recent direct wafer bonding advances and applications," Advances in Natural Sciences-Nanoscience and Nanotechnology, 2010, 11 pages.
Mott, D. et al., "Synthesis of size-controlled and shaped copper nanoparticles," Langmuir, 2007, vol. 23, No. 10, pp. 5740-5745.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(l), 6 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Ortleb, Thomas et al., "Controlling macro and micro surface topography for a 45nm copper CMP process using a high resolution profiler," Proc. Of SPIE, 2008, vol. 6922, 11 pages.
Paul, E. et al., "A model of copper CMP," J. Electrochem. Soc., 2005, vol. 152, Issue 4, pp. G322-G328.
Petition for Inter Partes Review of U.S. Pat. No. 7,485,968, IPR 2013-00381, filed Jun. 21, 2013, pp. 1-49.

Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Rhoades, Robert L., "The Dark Art of CMP," Future Fab International, Issue 24, 10 pages.
Roberds et al., "Low temperature , in situ, plasma activated wafer bonding," Electrochecmical Society Proceedings, 1997, vol. 97-36, pp. 598-606.
Rosales-Yeomans, D. et al., "Evaluation of pad groove designs under reduced slurry flow rate conditions during copper CMP," Journal of The Electrochemical Society, 2008, vol. 155, No. 10, pp. H812-H818.
Schmidt, Martin A., Wafer-To-Wafer Bonding for Microstructure Formation, Proceedings of the IEEE, vol. 86, No. 8, 1998, pp. 1575-1586.
Shigetou et al., "Cu—Cu direct bonding for bump-less interconnect," Research Center for Advanced Science and Technolog., University of Tokyo, Optoelectronic Packaging and Solder Bumps, (2002), pp. 628-639.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shimatsu, T. et al., "Metal bonding during sputter film deposition," J. Vac. Sci. Technol. A 16(4), 1998, pp. 2125-2131.
Shingo et al., "Design and fabrication of an electrostatically actuated MEMS probe card," Transducers, Solid-State Sensors, Actuators and Microsystems, 12th International Conference, Jun. 8-12, 2003, vol. 2, pp. 1522-1525.
Steinkirchner, J. et al., "Silicon wafer bonding via designed monolayers," Advanced Materials, 1995, vol. 7, No. 7, 7 pages.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Takagi et al., "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.

(56) References Cited

OTHER PUBLICATIONS

Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature bonding of lithium niobate and silicon wafers by argon-beam surface activation," Appl. Phys. Lett., 1999. vol. 74, pp. 2387.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.
Tong et al., "Low temperature wafer direct bonding," Journal of Microelectromechanical Systems, IEEE Service Center, Piscataway, NJ, vol. 3, No. 1, Mar. 1, 1994, pp. 29-35, XP-000885425, ISSN 1057-7157.
Tong, Q.Y. et al., "Semiconductor wafer bonding," Materials Chemistry and Physics, R25, 1999, 239 pages (exerpts).
Tong, Q.Y. et al., "Semiconductor wafer bonding: recent developments," Materials Chemistry and Physics, vol. 37, 1994, pp. 101-127.
Tong, Q.Y. et al., "Semiconductor wafer bonding: science and technology," 1999, 120 pages.
Tong, Q.Y. et al., "Semiconductor wafer bonding: science and technology," 1999, 159 pages.
Tong, Q.Y. et al., "Wafer bonding and layer splitting for microsystems," Advanced Materials, 1999, vol. 11, No. 17, pp. 1409-1425.
Topol et al., "Enabling technologies for wafer-level bonding of 3D MEMS and integrated circuit structures," 2004 Electronics Components and Technology Conference, 2004 IEEE, pp. 931-938.

Tsau et al., "Fabrication process and plasticity of gold-gold thermocompression bonds," Mater. Soc. Symp. Proc. 605, 171 (1999).
Tsau, C.H. et al., "Characterization of low temperature wafer-level gold-gold thermocompression bonds," Mater. Soc. Symp. Proc. 605, 1999, pp. 171-176.
Vossen, J. et al., "Thin Film Processes II," Academic Press, 1991, 62 pages.
Vossen, J. et al., "Thin Film Processes," Academic Press, 1978, 62 pages.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Warner, K. et al., "Low-temperature oxide-bonded three-dimensional integrated circuits," IEEE International SOI Conference, Oct. 2012, pp. 123-125.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Wikipedia, "Chemical bond," URL http://en.wikipedia.org/wiki/chemical_bond, accessed on Mar. 31, 2010, 10 pages.
Wikipedia, "Van der Waals force," URL https://en.wikipedia.org/wiki/Van_der_Waals_force, originally accessed on Mar. 31, 2010, 7 pages.
Xu et al., "New Au—Al interconnect technology and its reliability by surface activated bonding," Electronic Packaging Technology Proceedings, Oct. 28-30, 2003, Shanghai, China, pp. 479-483.
Yablonovitch, E. et al., "Van der Waals bonding of GaAs on Pd leads to a permanent, solid-phase-topotaxial metallurgical bond," Appl. Phys. Lett. 59, 1991, pp. 3159-3161.
Image showing a partial cross-section of Sony IMX260 BSI image sensor from Samsung Galaxy S7; product believed to be released Mar. 2016.
Image showing a partial cross-section of Omnivision OV16B10 16MP BSI image sensor from Huawei P20 Lite Phone; product believed to be released May 2018.
Miura et al., Fluctuation mechanism of mechanical properties of electroplated-copper thin films used for three dimensional electronic modules. In 2007 International Conference on Thermal, Mechanical and Multi-Physics Simulation Experiments in Microelectronics and Micro-Systems. EuroSime. Apr. 16, 2007 (pp. 1-6).
European Extended Search Report dated Sep. 23, 2024, in Application No. 21916596.6, 13 pages.

\* cited by examiner

FIG. 3A

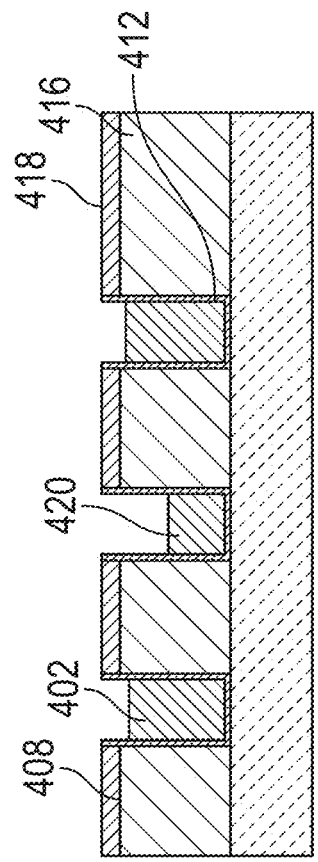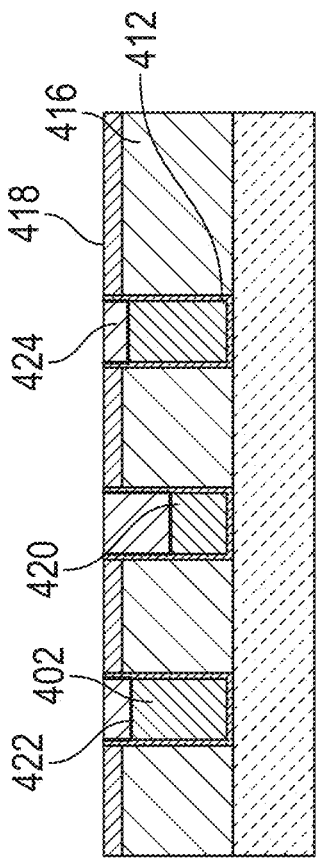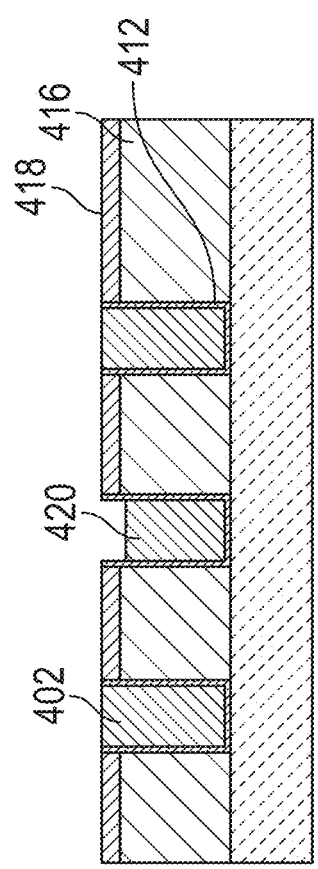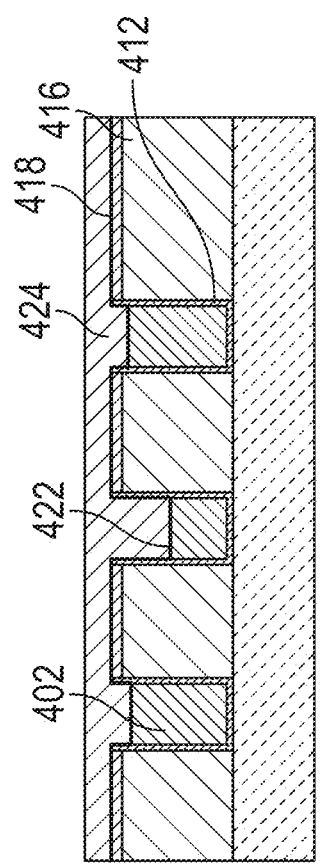
FIG. 4D
FIG. 4E
FIG. 4F
FIG. 4G

STRUCTURES WITH THROUGH-SUBSTRATE VIAS AND METHODS FOR FORMING THE SAME

CROSS-REFERENCE TO RELATED APPLICATIONS

This application claims priority to U.S. Provisional Patent Application No. 63/216,389, filed Jun. 29, 2021, titled "STRUCTURES WITH THROUGH-SUBSTRATE VIAS AND METHODS FOR FORMING THE SAME," and to U.S. Provisional Patent Application No. 63/131,263 filed Dec. 28, 2020, titled "STRUCTURES WITH THROUGH-SUBSTRATE VIAS AND METHODS FOR FORMING THE SAME," the entire contents of each of which are hereby incorporated herein by reference.

BACKGROUND

Field

The field relates to structures with through-substrate vias and methods for forming the same.

Description of the Related Art

Semiconductor elements, such as integrated device dies or chips, may be mounted or stacked on other elements. For example, a semiconductor element can be mounted to a carrier, such as a package substrate, an interposer, a reconstituted wafer or element, or other semiconductor element. As another example, a semiconductor element can be stacked on top of another semiconductor element, e.g., a first integrated device die can be stacked on a second integrated device die. In some arrangements, a through-substrate via (TSV) can extend vertically through a thickness of the semiconductor element to transfer electrical signals through the semiconductor element, e.g., from a first surface of the semiconductor element to a second opposing surface of the semiconductor element. There is a continuing need for improved methods of forming TSVs.

BRIEF DESCRIPTION OF THE DRAWINGS

Specific implementations will now be described with reference to the following drawings, which are provided by way of example, and not limitation.

FIGS. 3A and 3B are example wafer maps of etched wafers.

FIGS. 4A-4I illustrate a method for forming a microelectronic structure, according to various embodiments.

DETAILED DESCRIPTION

FIGS. 1A-F illustrate various conventional processing steps for forming TSVs in a microelectronic structure. Conventionally, the formation of TSVs can be performed using via-middle or front side via-last processing methods. Both of these methods are high volume manufacturing processes for different dies, including e.g. 40 um thick dies. Both of these processes involve etching through the TSVs into the bulk silicon after integrated circuit fabrication. Technical challenges of these processes increase with a reduction in the die thickness. These challenges can include TSV etch uniformity, die thickness uniformity, and the overall quality of the backside dielectric layer that is formed.

Figure 1A:
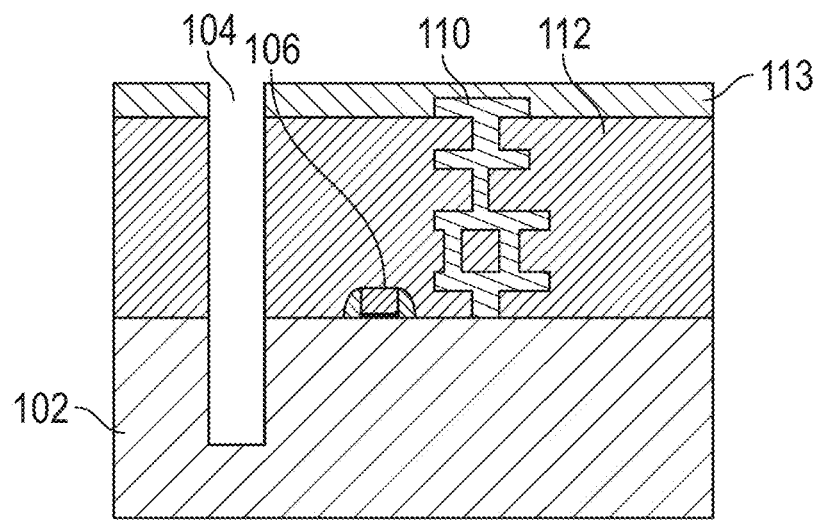
FIGS. 1A-1F show conventional processing steps for forming TSVs in an element.

In FIG. 1A, the microelectronic structure comprises a portion of a semiconductor wafer 102. The illustrated via structures comprise via-middle structures in which active circuitry 106, e.g., transistors or other active circuit elements, can be formed on or in the active surface of a bulk semiconductor portion 102, one or more insulating layers 112 and 113 can be formed over the active circuitry 106, and an opening 104 for the TSV can be formed through the one or more insulating layers 112 and 113 and a portion of the bulk semiconductor portion 102. In some arrangements, a metallization layer 110, for instance a back-end-of line (BEOL) or redistribution layer (RDL), can be provided over or within one or more insulating layers.

Figure 1B:
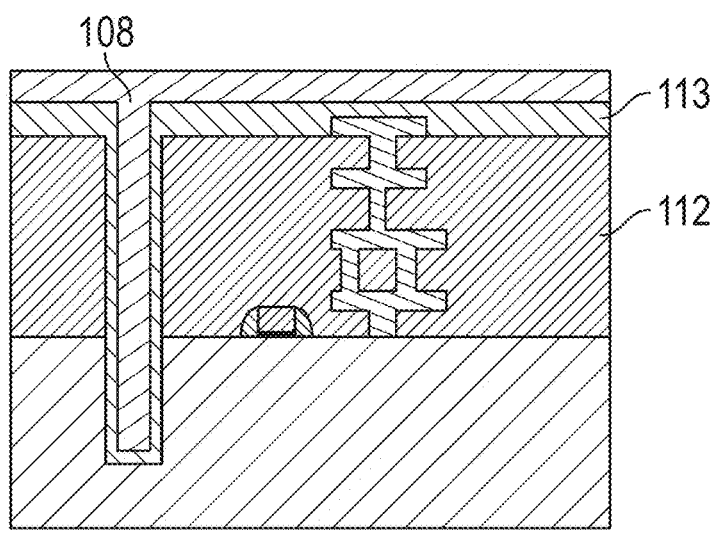
Figure 1C:
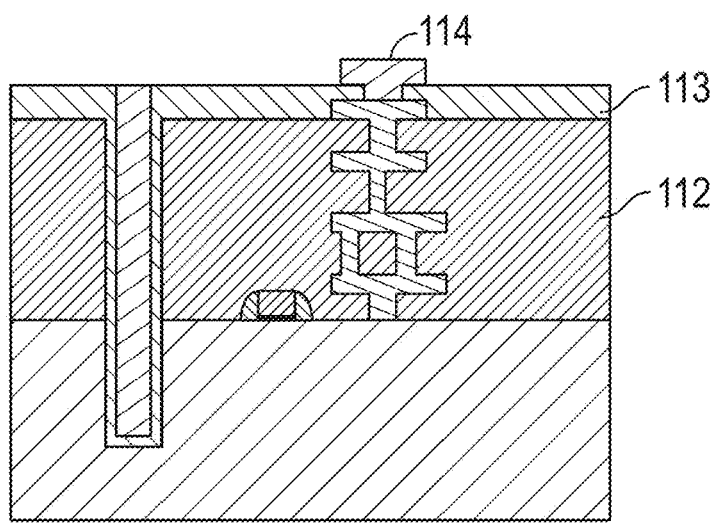
Figure 1D:
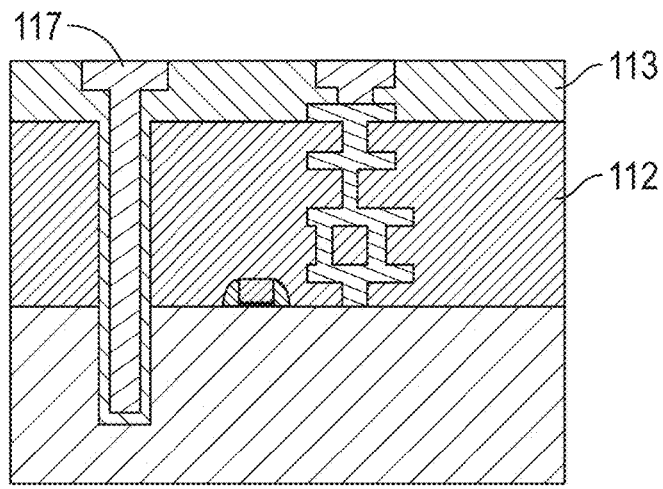

In FIG. 1B, a via structure 108 can be provided. The via structure 108 can extend into the opening and over insulating layers 112 and 113. In FIG. 1C, a conductive pad 114 can be provided over one or more of the insulating layers and electrically connected to the metallization layer 110. Conductive overburden from electroplating the via structure 108 in FIG. 1B can be removed (e.g., polished away) in FIG. 1C. As shown in FIG. 1D, a conductive pad 117 can be provided over the one or more insulating layers 112 and 113 and electrically connected to the via structure 108. The conductive pad 117 can also be configured to electrically connect to another element. In some arrangements, the conductive pad 117 can be part of a BEOL or RDL.

Figure 1E:
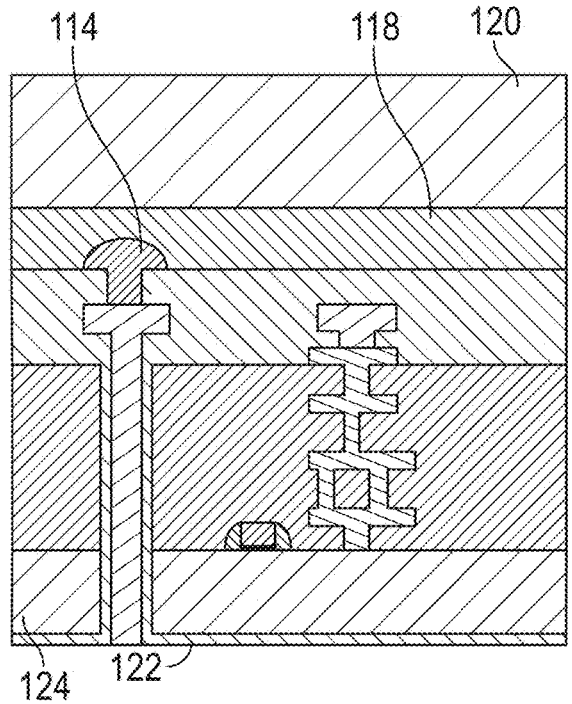
Figure 1F:
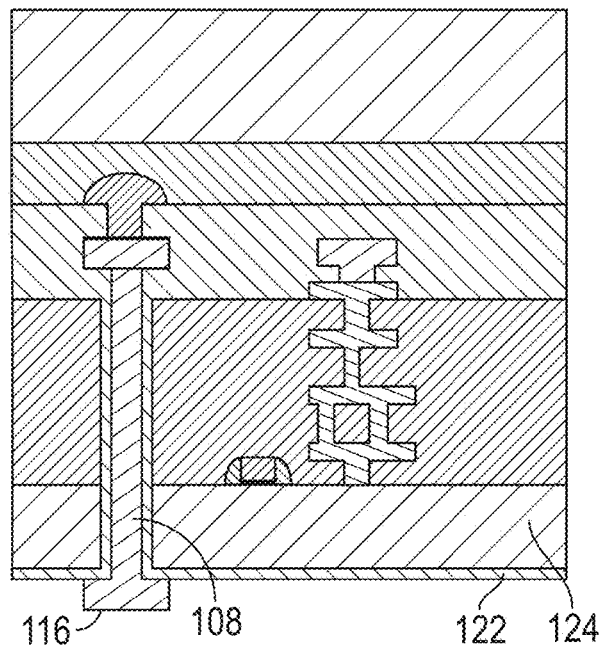

As shown in FIG. 1E, a frontside of the microelectronic structure 114 can be attached to a carrier 120 by way of an adhesive 118. The carrier 120 can comprise a temporary handle wafer that is used to support the microelectronic structure 114 during processing. In some embodiments, the adhesive 118 can comprise an organic adhesive and can be sensitive to high temperatures. Accordingly, the use of the adhesive 118 to attach the carrier 120 to the microelectronic structure 114 may limit the temperatures that can be applied during processing. In other embodiments, however, the carrier 120 can be directly bonded to the frontside of the microelectronic structure 114 without an adhesive 118. While the frontside 114 is attached to the carrier 120, the backside of the semiconductor portion 124 can be grinded or ground down to expose the vias 108. As shown in FIG. 1F, a dielectric layer 122 may be deposited on the back side surface of the semiconductor 124. A backside metallization layer 116, for instance a back-end-of line (BEOL) or redistribution layer (RDL), can be provided over the dielectric layer 122 and can be configured to electrically connect to the via structure 108.

Figure 2:
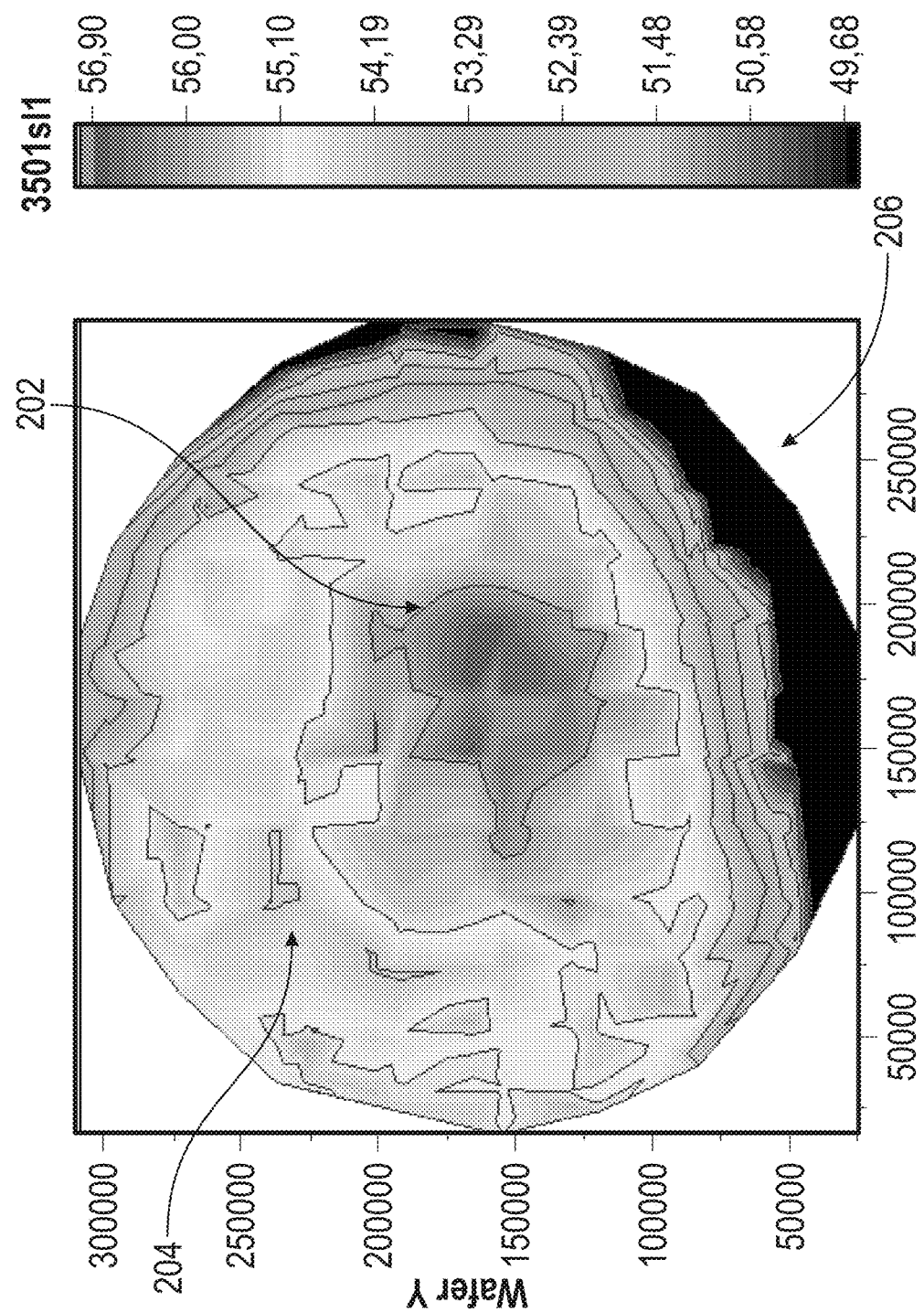
FIG. 2 shows an etch depth map of a processed wafer.

The conventional via formation process has several problems that lead to non-uniform via lengths. For example, the etch process used to form the openings for the vias is non-uniform across the substrate, e.g., wafer, particularly for the high aspect ratio openings used for vias, which leads to via openings having different depths. This non-uniformity in produced vias causes yield loss during the TSV reveal process. Moreover, dielectric deposition, which is part of the TSV reveal process, may be limited by the temporary bond material used to adhere the die to a carrier. The adhesive limits the backside dielectric deposition temperature and can cause various processing complications. Furthermore, temporary bond layer thickness non-uniformity can add to the thinned silicon wafer thickness uniformity. Indeed, as shown in FIG. 2, for a 12 inch wafer, the etch process that is used to form the via openings can have a non-uniformity of approximately 7 microns. In some areas of the wafer, the etch depth may be higher 202, while some areas of the wafer with have low etch depths 206, other areas of the wafer will have etch depths 204 between the low 206 and high 202 etch depths. The varying depth of the via openings leads to different via structure lengths once the conductive material, for instance copper, is filled into the openings.

Figure 3A:
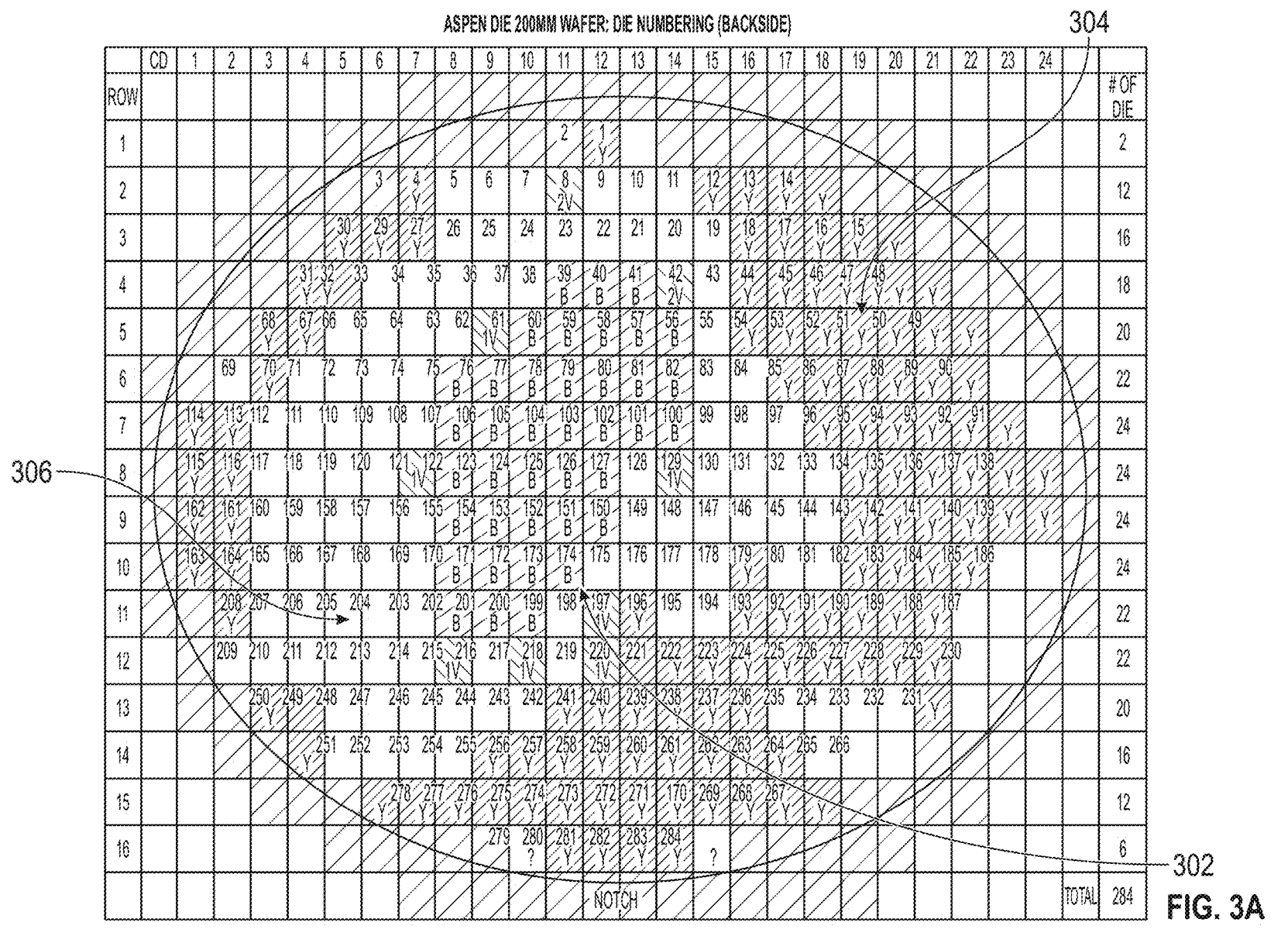

As shown in FIG. 3A, the different via lengths can lead to a significant loss in yield. This loss of thickness, for example, when combined with wafer thickness variations caused by the temporary processes can further decrease the TSV yield. For instance, dies that have TSVs that are too short 304 to be effective and dies that have TSVs that are too long 302 to be effective may not be used. For example, some dies within the wafer may have TSVs that are too long 302 and break off during grinding or polishing. Other vias are too short 304 and are buried in the semiconductor portion of the device. Additionally, in some processes, non-uniform TSVs may result from incomplete or non-uniform plating procedures. For example, in such processes, the via openings may be etched uniformly, but the plating process through the high aspect ratio openings may not uniformly fill the via openings. This process variation reduces the number of dies that are effective 306. Accordingly, non-uniform TSV lengths may result from a variety of different processing methods.

Figure 3B:
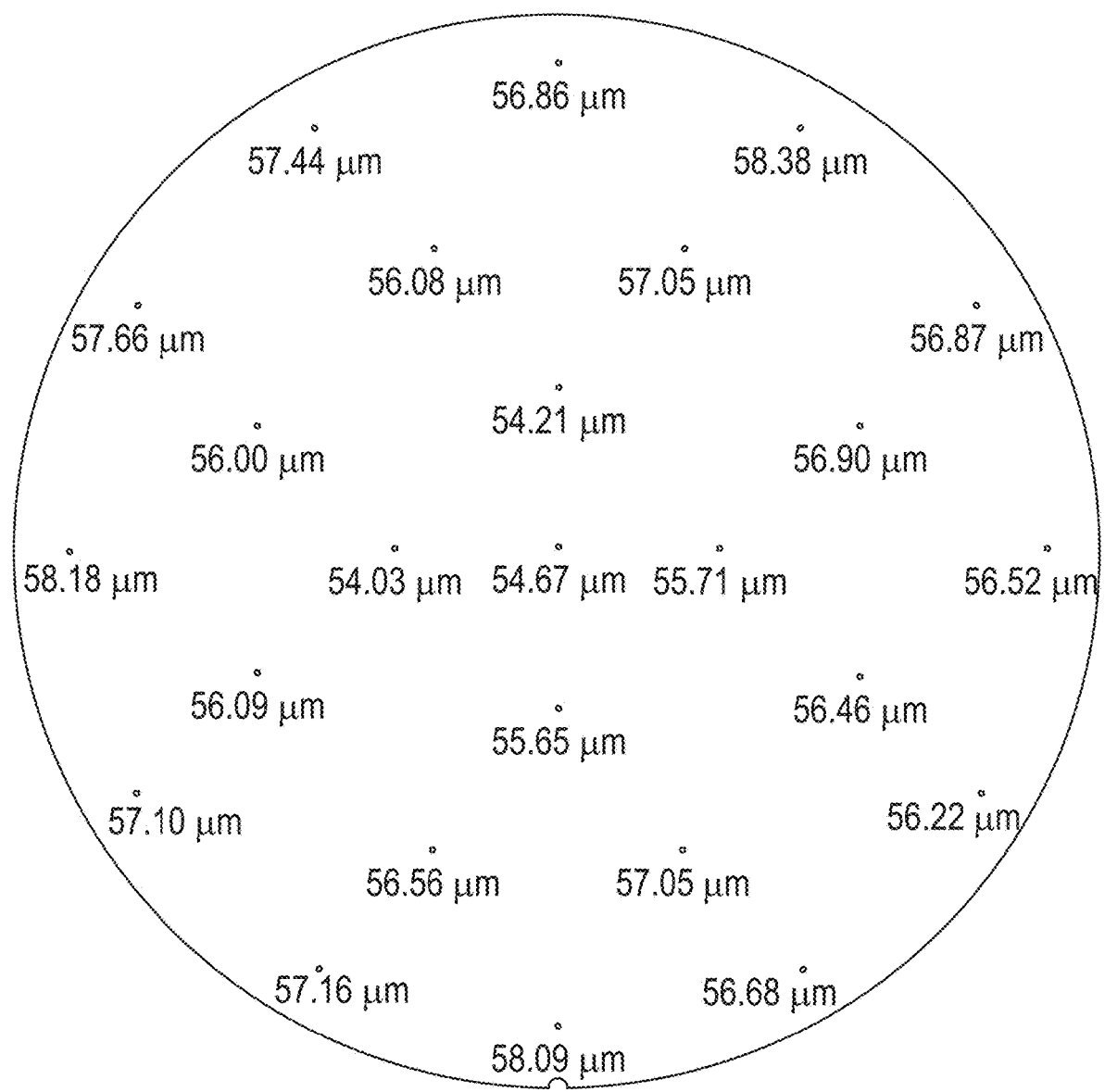

FIG. 3B illustrates the thickness variation on an 8" wafer that can be measured after TSV planarization. As can be seen, the thickness of the wafer can vary by 4 microns. Some regions of the wafer can have a thickness of up to 58.09 microns, while other regions of the wafer can have a thickness of 56.09 microns, while other regions of the wafer can have lower thicknesses around 54.67 microns. Wafer thickness variation can also cause some TSVs to be rendered ineffective and lead to lower levels of process control.

As explained above, due to, e.g., die thickness non-uniformity and TSV opening etch non-uniformity, the lengths of the TSVs may vary considerably across the wafer after grinding the backside of the semiconductor portion to reveal the TSVs. Accordingly, as the backside of the bulk semiconductor portion is ground or otherwise thinned, the exposed vias may protrude from the backside of the thinned semiconductor portion by varying lengths and some vias, as explained above, may remain unexposed and buried in the semiconductor portion. To reduce the non-uniform lengths of the TSVs while preventing breakage of the protruding TSVs, one or more backside dielectric layers can be provided over the backside of the semiconductor portion and over the TSVs. While it may be possible to employ solder bumping despite some degree of TSV height variability, the variability leads to a lack of levelness and makes stacking difficult. Some stacking technologies, such as direct hybrid bonding, are especially sensitive to topographical variations.

For example, in some processes, about 6 to 7 microns of the TSV protrudes from the backside of the semiconductor portion after initial backside silicon grinding and selective removal of silicon relative to the liner of the TSV by wet or dry etching methods. A barrier layer, e.g., a dielectric barrier layer, such as silicon nitride, silicon oxynitride, silicon carbonitride, diamond-like carbon, or any other suitable dielectric barrier material layer, can be deposited over the backside of the semiconductor portion, over a sidewall of the exposed TSVs, and over the exposed end surfaces of the exposed TSVs. A second dielectric layer, such as silicon oxide or any other suitable dielectric, can be deposited over the dielectric barrier layer, including over the upper surface of the barrier layer, over the portion of the barrier layer that extends along the sidewall of the exposed TSVs, and over the portion of the barrier layer that is disposed along the end surface of the exposed TSVs. After depositing the backside dielectric layer(s), the vias and portion(s) of the dielectric layer(s) can be polished, or otherwise removed, to planarize the vias and reduce non-uniformities.

In other processes, thinner layer(s) of the first dielectric barrier layer and/or the second dielectric barrier layer may be deposited over the thinned semiconductor portion and the vias. For example, in other processes, the dielectric layer(s) may be only 1 or 2 microns thick, e.g., significantly thinner than the length of the protruding portions of the vias. When the vias and dielectric layer(s) are polished, some of the vias may break off, such that the ends of the vias are embedded in the semiconductor portion and recessed relative to the backside of the semiconductor portion. Broken TSVs can reduce device yield.

In some of these processes, the chosen metal within the TSVs can lead to significant changes in TSV performance. For instance, in some processes, copper (Cu) can be an effective deposition metal. Copper, when used in TSVs, is an alloy metal that may be used and may change expansion and polishing characteristics of the TSV. Copper at the bottom of the etch via may be generally confined and may not anneal at the same rates or the same temperatures as free copper. These different properties can lead to a Cu TSV that does not have a stabilized crystallography prior to the revealing of the TSV in the deposition processes. Furthermore, TSV metallization may include metallic or organic impurities that are unsuitable for reliable direct bonding by, for example, Direct Bond Interconnect® processes. Furthermore, shrinkage of TSVs during storage or thermal processing has been shown to cause topographical issues, e.g. the formation of rims or trenches, in the isolation oxide which may surround the TSV.

Some major issues that reduce the yield of conventional TSV formation processes include non-uniformity in TSV etch depths and TSV breakage during polishing. TSV can have a typical depth variation of 2 to 4 um over a 300 mm wafer out of a total of a 55 um depth. This variation in depth may create challenges for achieving uniform surface bonding. Moreover, non uniform TSVs can cause breakage during processing leading to lower yields. Silicon wafers may be planarized using chemical mechanical processing (CMP) planarization. Some TSVs may be broken off during CMP planarization. This breaking may be in part caused by excessive TSV reveal which often is caused by the depth variation in TSVs.

Conventionally, backside TSV processing has not been used for direct bonding in high volume manufacturing. Conventional procedures for planarizing TSVs on the back side of wafers may also rely on patterning copper pads and adding solder bumps to the wafers. Conventional backside processing also does not protect against breaking off of TSVs and may not achieve planarity suitable for direct bonding. These processes may not be suitable for high volume manufacturing because of the length of polishing time, the number of polish cycles—which may range from 4 to 6 cycles and take up to 2 hours of machine time, the amount of material that is deposited (5 um), the amount of material removed (2-4 um depending on the oxide deposited), and the total annealing time used between polishes (3-5 one hour annealing cycles).

Various embodiments disclosed herein can improve device yield by ensuring that TSV length is uniform throughout the thinned wafer. Some embodiments may use a copper wet etch to lower the copper TSV surface up to a few microns below the silicon surface. In some embodiments, surrounding silicon bulk will help to restrain and stabilize the copper within the TSVs. In some embodiments, barrier layers are deposited before the deposition of copper seed layers. In some embodiments electroplating techniques are used to fill the vias. In some embodiments, some TSVs may be deeper than other TSVs and electroplating processes may be used to accommodate broken TSV additional depths.

In some embodiments, the annealing processes stabilize the copper plug material so as to provide it with similar chemical and structural properties as device-side copper used for bonding. In some embodiments, the annealing processes stabilizes the copper plug material to have the same impurity and texturing characteristics of the device side bonding copper. In some embodiments, plated copper can be annealed as a direct bonding interface. This annealing may stabilize the copper plug material, making the plug material chemically and physically resemble the device side direct bonding interface copper pad.

In some embodiments, CMP used on the copper layers can comprise a standard direct bond interface CMP slurry and process. In some embodiments, the CMP for TSVs can be the same as the device side CMP in terms of slurry usage and machine time. In some embodiments, the CMP parameters may be the same or similar to the device side CMP parameters. In some embodiments, this CMP uniformity can be achieved with or without the use of additional photolithography steps. In some embodiments, the only photolithography steps that are used during the CMP process may be blanket backside processing.

Figure 4A:
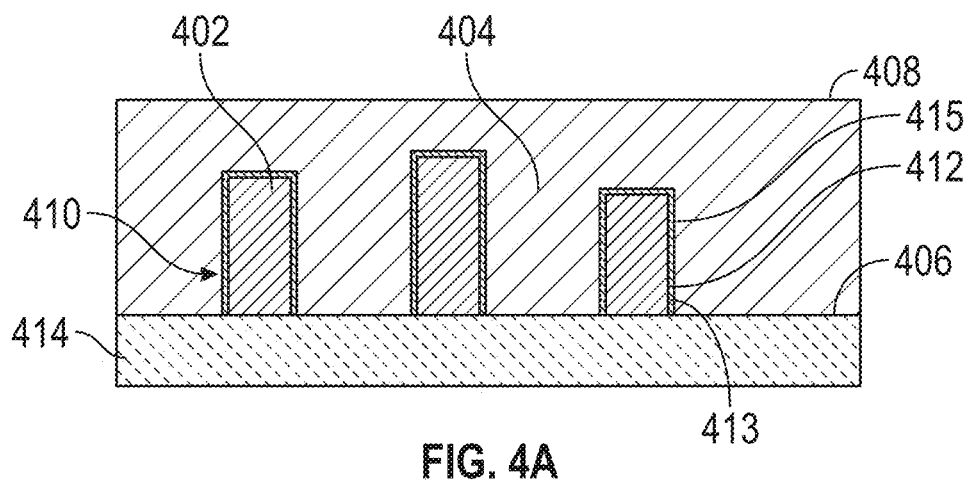
Figure 4B:
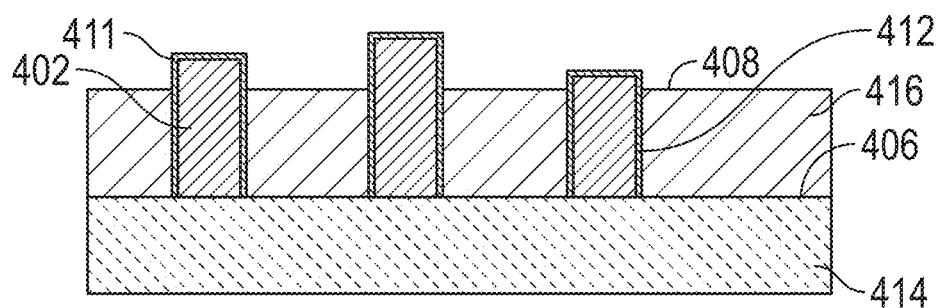
Figure 4C:
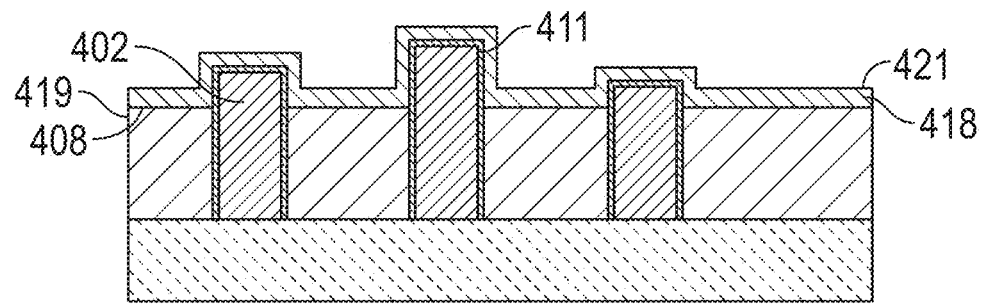

FIGS. 4A-4I illustrate a method for forming a microelectronic structure, according to one embodiment. As shown in FIG. 4A, and as explained above, TSV structures 410 can be provided at least partially through a thickness of substrate that includes a bulk semiconductor portion 404. In some embodiments, the bulk semiconductor portion 404 can comprise silicon, germanium, silicon carbide or any other suitable semiconductor material. One or multiple lining layers 412 can be provided in the openings from a front surface 406 of a substrate. The one or more lining layers 412 can comprise a dielectric liner 415 in some embodiments. The dielectric liner 415 of the one or more lining layers 412 can comprise silicon nitride, silicon oxynitride, silicon carbonitride, diamond-like carbon, and any other suitable dielectric material. In some embodiments, the one or more lining layers 412 can additionally or alternatively include a first lining barrier layer 413. Although FIG. 4A schematically illustrates the layer 412 as a single layer, it should be appreciated that the layer 412 can comprise multiple layers or sub-layers, including, e.g., a dielectric liner 415 and a lining barrier layer 413. A first conductive via 402 can be provided in the openings over the lining layer(s) 412. In some embodiments the first conductive via 402 can comprise copper, although other suitable metals may be used. The first conductive via portion 402 can be provided from the front surface of the substrate 406. The first lining barrier layer 413 can comprise a conductive barrier for reducing diffusion of the conductive via material. The first lining barrier layer 413 may be a different material from the conductive material of the first 402 and second 424 conductive via portions. The first lining barrier layer 413 may be configured to reduce diffusion of the conductive material of the first 402 and/or second 424 conductive via portions into the surrounding dielectric and/or semiconductor materials. Examples of materials used for the first lining barrier layer 413 include, metal and metal nitride materials, such as titanium nitride, tantalum nitride, and any other suitable metal and metal nitride material. The first conductive via portion 402 can be electroplated within the opening over a seed layer. The front surface or side of the wafer, e.g., the first surface 406 may comprise an active side of the semiconductor portion with active integrated circuitry, such as transistors, formed in or on the active side. The front or first surface 406 of the wafer can be mounted to a carrier 414. The carrier 414 may serve as a temporary handle wafer in some embodiments. In some embodiments, the microelectronic structure can be attached to the carrier 414 with an adhesive. In other embodiments, the microelectronic structure can be directly bonded to the carrier 414 without an intervening adhesive, using the direct bonding techniques described in more detail below. As shown in FIG. 4A-C, the TSVs 410 can have variable heights across the substrate due to variable etching through a significant depth through bulk semiconductor.

In FIG. 4B, the backside of the semiconductor portion, the second side, 408, also a back surface of the substrate at this stage, can be thinned, by dry etching or otherwise removed, to reveal the TSVs. 410. As shown, the TSVs 410 can protrude beyond the backside of the semiconductor portion 408. As explained above, the lengths of the TSVs 410 may be non-uniform across the wafer, such that the TSVs 410 protrude by varying lengths above the semiconductor portion 416. The etch process may leave the via structures 410 intact, such that the one or more lining layer(s) 412, including dielectric liner 415 and first lining barrier layer 413, remain disposed over and along a sidewall 411 of the first conductive via portion. In FIG. 4C, one or more dielectric layers 418 can be provided, e.g., deposited, over the upper surface 408 of the bulk semiconductor portion 416, along sidewalls 411 of the via structures 410, and over end surfaces of the via structures 410 to define a back surface of the substrate 408. Although FIG. 4C schematically illustrates the layer 418 as a single layer, it should be appreciated that the layer 418 can comprise multiple layers or sub-layers. In various embodiments, dielectric layer(s) 418 can be a first dielectric barrier layer 419 provided on the bulk semiconductor portion 416 and on the via structure 410. The dielectric layer(s) 418 can further comprise a second dielectric layer 421 over the first dielectric barrier layer 419. In various embodiments, the first dielectric barrier layer 419 can comprise a material to reduce copper migration, such as, e.g., silicon nitride, silicon oxynitride, silicon carbide, silicon carbonitride, diamond-like carbon (DLC), or any other suitable dielectric barrier layer material. The second dielectric layer 421 can comprise a lower k dielectric material, and can be an inorganic dielectric, such as silicon oxide. As shown in FIG. 4C, the TSVs 410 can protrude beyond the semiconductor portion 408 by a distance in a range of about 0 to 10 microns, 1 to 7 microns, or 5 to 6 microns. Further as explained herein, the TSVs 410 can break off, as seen in TSV 420, and be recessed within the semiconductor portion 416 and/or the dielectric layer(s) 418 by a distance in a range of 0 to 10 microns, 1 to 7 microns, or 2-6 microns. The thickness of the dielectric layer(s) 418 can be in a range of about 2 to 7 microns, in a range of about 3 to 7 microns, or in a range of 4 to 6 microns, or about 5 microns in one embodiment.

In FIG. 4D, the via structures 410 and dielectric layer(s) 418 can be planarized, for example, using a chemical-mechanical polishing (CMP) process applied to the back surface of the substrate 408. As explained herein, the planarization process may break off one or more of the TSVs 410, for instance the middle TSV 420. In FIG. 4D, for example, the middle TSV 420 is shown as having broken off such that the TSV 420 is embedded within and recessed below the surface of the dielectric layer(s) 418 and/or semiconductor portion 416. As explained above, broken TSVs, like the middle TSV 420, can reduce device yield for the wafer. Depending upon selected chemistries for the CMP slurry, some or all other TSV's 410 may also be recessed below dielectric layer(s) and/or semiconductor portion.

In FIG. 4E, the first conductive via portion 402 can be selectively etched so as to be recessed below the back surface of the substrate 408, e.g., below the dielectric layer(s) 418 and/or the semiconductor portion 408. Because the middle TSV 420 broke off, the depth of the etch for the middle via structure 420 is deeper than the etch for the other via structures 410. In various embodiments, a selective copper wet etch can be performed to etch only a portion of the first conductive via portion 402. Advantageously, in the illustrated embodiment, all of the TSVs 410 across the substrate 416 are recessed to some degree, at least below the upper surface of the added dielectric layer(s) 418. In other embodiments, recessing of the TSVs 410 can be accomplished during the CMP described above with respect to FIG. 4D. In still other embodiments, not all TSVs 410 are recessed, and only some TSVs 410 are recessed, whether or not a separate recessing process is employed. For example, in some embodiments, a conventional CMP process is employed in which some TSVs 410 are substantially recessed below the surface 408, e.g., due to breaking off.

As shown in FIG. 4F, to improve yield and to provide a planarized, high quality bonding surface, a second barrier layer 422 can be provided over the exposed end surface of the first conductive via portions 402 and along the lining barrier layer 412. A seed layer (not illustrated) can be provided over the second barrier layer 422, and a second conductive via portion 424 can be provided, by for instance, electroplating, over the second barrier layer 422 from the back surface of the substrate 416. The microelectronic structure can be annealed, which can beneficially promote grain growth to improve direct bonding. Advantageously, the deposition process, for instance, electroplating, and an anneal process can both be selected to prepare for direct hybrid bonding, as opposed to the plating process that was used to fill the TSV 410 vias in the first place, which is selected to improve filling of high aspect ratio, deep vias.

In various embodiments, alloying additives can be provided to the conductive material of the TSV 410. The alloying additives can be provided to control thermal expansion and/or improve corrosion resistance of the conductor. In some embodiments, the conductor is copper, silver, gold, or any other suitable conductive material. The alloying additive material(s) can include metallic elements, for example, beryllium, indium, gallium, nickel, and manganese, typically representing less that 5 atomic % and more particularly less than 2 atomic % of the TSV 410. The alloying additive may be provided as part of the seed layer or the second barrier layer 422 and diffuse therefrom. Such alloying elements can be present in different amounts to affect the TSV 410 hardness, corrosion resistance and/or to pin grain formation during subsequent anneal. Because larger grains are desirable in the second conductive portion to aid interdiffusion in a direct metal-to-metal bonding process, the first conductive portion 402 may contain a smaller percentage of the alloying elements as compared to the second conductive portion 424. For example, in some embodiments, the second conductive via portion 424 can have at least 5% less, at least 10% less, at least 15% less, or at least 20% less of the alloying element(s) as compared to the first conductive via portion.

In addition, one or more organic additives, such as levelers, suppressors, accelerators, can be provided to the plating bath during formation of the TSV 410 to improve filling. In various embodiments, different additives and/or different proportions of additives, e.g., fewer additives, may be provided when plating the second conductive via portion 424 as compared to the type or amount of additives used when plating the first conductive via portion 402 that fills the opening. For example, in some embodiments, additives may be used when plating both the first 402 and second 424 conductive via portions, but the amount of additives used for the first conductive via portion 402 may be substantially different than the amount used for the second conductive via portion 424. In some embodiments, more additives may be used when plating the first conductive via portion 402 than when plating the second conductive via portion 424. In some embodiments, additives, such as organic additives, may be provided during electroplating of the first conductive via portion 402 to, e.g., improve filling, but different proportions or different types of organic additives may be provided during electroplating of the second conductive via portion 424. In various embodiments, the plating bath for the first conductive via portion 402 can include a higher percentage of organic additives as compared to the plating bath for forming the second conductive via portion 424. Accordingly, the first conductive via portion 402 may have a higher percentage of impurities, such as sulfur, oxygen, nitrogen, and/or carbon, as compared to the second conductive via portion 424. In various embodiments, the first conductive via portion 402 can be formed in a plating bath have a higher concentration of leveler, e.g., Janus Green, which introduces more impurities, such as nitrogen, carbon, and/or oxygen, as compared to the second conductive via portion 424. In both portions 402 and 424, the impurities from additives may be measured in part per million (ppm).

After electroplating, impurities from the plating additives, e.g., carbon, nitrogen, sulfur, oxygen, amongst other impurities, may be incorporated in the first 402 and/or second 424 conductive via portions. In some embodiments, the amount of impurities present in the first conductive via portion 402 may be more than the amount of impurities present in the second conductive via portion 424. In some embodiments, only trace amounts of the impurities may be present in the second conductive via portion 424. Further, the impurities present in the second conductive via portion 424 can have a different composition and/or concentrations compared to the first conductive via portion 402. These compositions may be selected to influence the grain size, orientation or thermal stability of the interconnect that can be formed by the second conductive portion. Impurities can include other material elements present within the conductive vias with concentrations less than 2 atm. %, e.g., less than 100 ppm or less than 50 ppm. In one embodiment, the impurities in the second conductive via portion 424 can be less than the impurities in the first conductive via portion 402. For example, in some embodiments, the second conductive via portion 424 can have at least 5% less, at least 10% less, or at least 20% less non-copper elements (e.g., such as metallic alloying elements, or impurities from plating bath additives) than the first conductive via portion 402.

In FIG. 4G, portions of the second conductive via portion 424 and the second barrier layer 422 that overlie the dielectric layer 418 can be removed, for example, using a CMP process applied to the back surface of the substrate. The polishing process can expose and planarize the dielectric layer(s) 418, and can serve as a preparatory step for direct bonding, i.e., a very high degree of polishing accomplishes planarity sufficient for direct bonding. Beneficially, the middle broken TSV 420 has been repaired, the metal recess is provided at a suitable depth, and the polished dielectric layer(s) 418 and second conductive via portions 424 can be used in a direct bonding process. For example, the plating and annealing process can form grains, e.g., copper, gold, or silver grains, or metal texture, e.g., copper, oriented along a 111 crystal plane primarily perpendicular to the bond surface, which can enhance metal diffusion and bonding during a direct bonding process. In various embodiments, the metal texture can be oriented so as to have a geometric component that is generally perpendicular to the bond surface. In some embodiments, the second conductive via portion 424 can have a first proportion of 111 planes oriented within 30° of vertical, e.g., within 30° of a vertical axis extending along a longitudinal dimension of the via structure, within 20° of vertical, or within 10° of vertical. The second conductive via portion 424 can have a second proportion of 111 planes oriented within 30° of vertical, e.g., within 30° of a vertical axis extending along a longitudinal dimension of the via structure, within 20° of vertical, or within 10° of vertical. In some embodiments, the second proportion can be greater than the first portion. In the illustrated embodiment, where either CMP selection, see FIG. 4D and corresponding description, or subsequent recessing, see FIG. 4E and corresponding description, are selected to ensure some degree of recessing across the substrate, each TSV 410 may include both first 402 and second 424 conductive via portions. In other embodiments, not all TSVs 410 are recessed across the substrate at the stage of FIG. 4E, and only some TSVs 410 include the second conductive via portion 424. In any case, the CMP process selected to achieve the structure of FIG. 4G can be selected to facilitate subsequent direct hybrid bonding. Accordingly, each of the TSVs 410 may be recessed below the dielectric layer(s) 418 upper surface, for example, by less than 40 nm, less than 30 nm, less than 20 nm, less than 15 nm or less that 10 nm, but more than or equal to about 5 nm, e.g., more than or equal to about 2 nm.

Figure 4H:
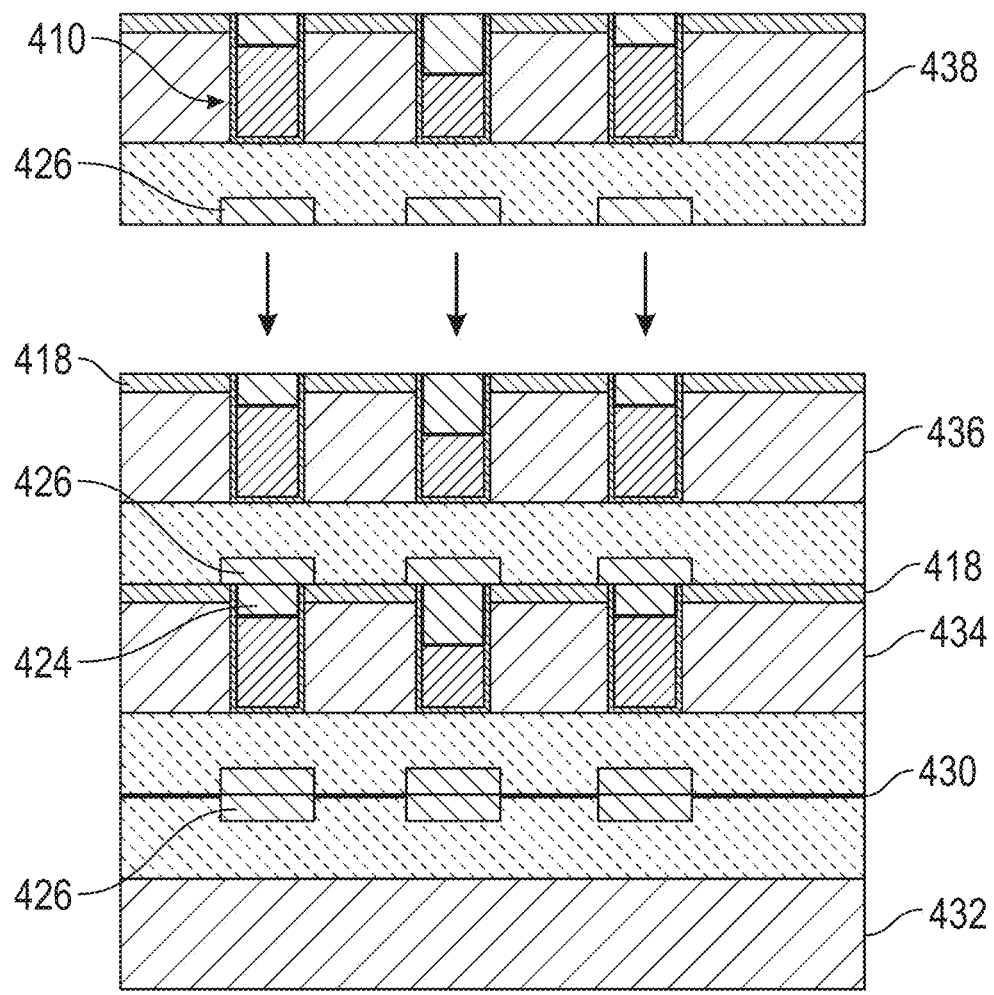

As shown in FIG. 4H, the microelectronic elements described above can be utilized in a multi-die or multi-element stack. For example, a first stacked die 434 can be directly bonded to a base wafer 432 without an adhesive. In some embodiments, the front active surface can be bonded to the base wafer. As explained below, contact pads 426 of the first die can be directly bonded to contact pads 426 of the wafer without an adhesive, and nonconductive regions can be directly bonded to corresponding nonconductive regions of the wafer without an adhesive 430. Additional devices can be stacked and directly bonded to the backside of the microelectronic structure. For example, as shown contact pads 426 of a second element or die 436 can be directly bonded to the exposed TSV structures 410 of the first element 434 without an adhesive. Nonconductive regions of the second element or die 436 can be directly bonded to the dielectric layer(s) 418 without an adhesive. Additional elements can be directly bonded to the second element or die to form any number of elements in the stacked and directly bonded structure. In some other applications, processed wafers with the methods described herein may be assembled or stacked and directly bonded to each other without an intervening adhesive layer.

Figure 4I:
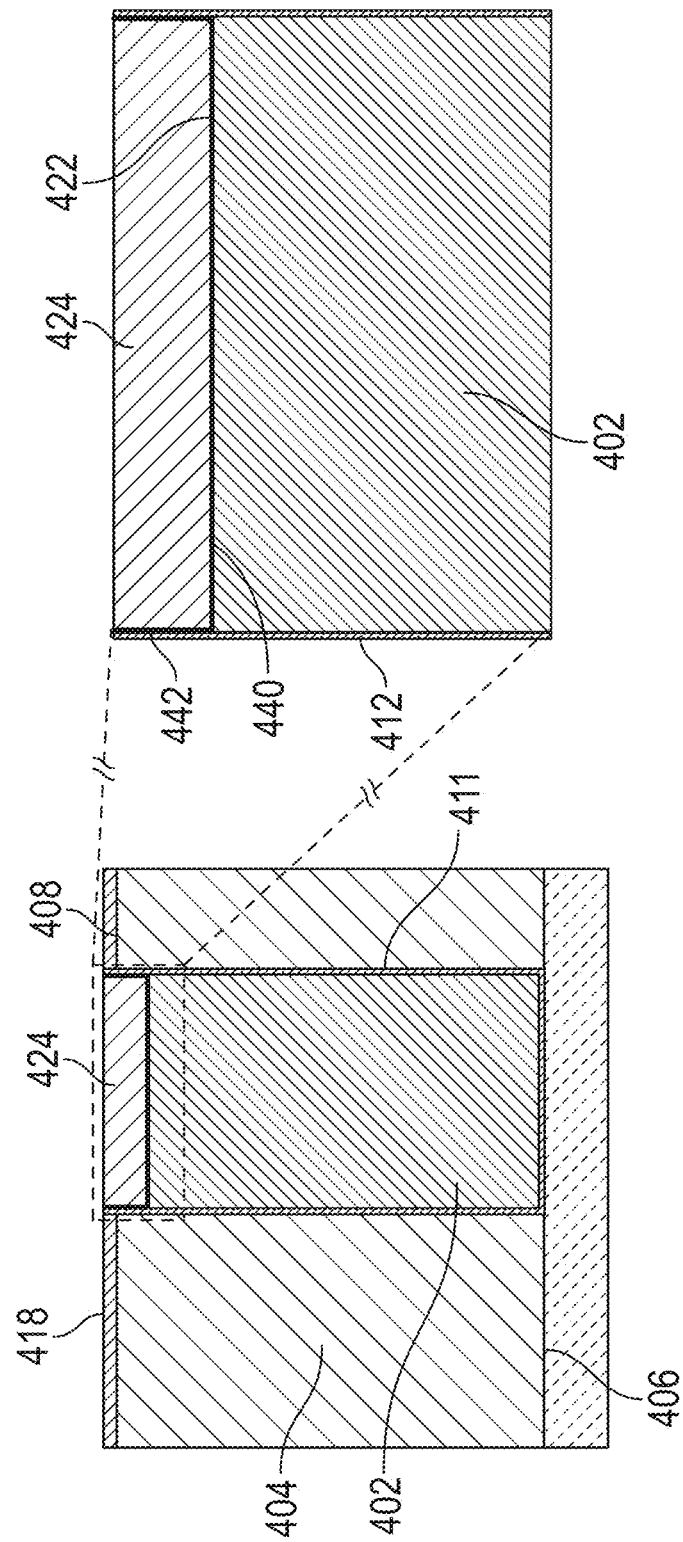

FIG. 4I illustrates the via structure 410 formed using various disclosed embodiments. As shown, the microelectronic structure can include a bulk semiconductor portion 404 having a first/front surface 406 and a second/back surface opposite the first surface 408. In some embodiments, the second surface 408 can comprise an active surface having active circuitry formed in or on the second surface. Additionally or alternatively, in some embodiments, the first surface 406 may comprise an active surface having active circuitry formed in or on the second surface. In other embodiments, the first surface 406 may comprise an inactive surface devoid of active circuitry. The via structure 410 can be disposed in an opening extending at least partially through, e.g., completely through, the bulk semiconductor portion 404 along a direction non-parallel to the first surface. The via structure can include a first conductive via portion 402, a second conductive via portion 424, and a second barrier layer 422. The second barrier layer 422 includes a first portion 440 disposed between the first conductive via portion 402 and the second conductive via portion 424. The second barrier layer 422 can also include a second portion 442 disposed along the sidewall 411 of the second conductive portion 402. The second conductive via portion 424 can extend from the second barrier layer 440 to at least the surface of the substrate 408. As noted above, the second conductive via portion 424 can have a different composition from the first conductive via portion 402.

Both the first 402 and second 424 conductive via portions can be formed of copper, for example, but have different types and/or concentrations of alloying elements and impurities, e.g., originating from the types of levelers, suppressors, accelerators, plating current densities, used in the electroplating process, and/or different grain sizes and/or orientations. For example, the first 402 and/or second 424 conductive via portion can have different proportions of non-copper elements, such as metallic alloying elements, or impurities from plating bath additives. The first via portion 402 can have more non-copper elements than the second 424 via portion. In some embodiments, the first via portion 402 can have alloying elements, such as Be, Mn, Ni, incorporated via diffusion from the barrier layer 412 or via the seed layer. The second via portion 424 may not have such non-copper elements, or only trace levels of such impurities. The second via portion 424 may have such non-copper elements but a smaller amount as compared to the first via portion. The alloying material(s) incorporated via the barrier layer(s) 412 and/or the seed layer during plating can be provided in some arrangements to pin grains of the first via portion 402. In addition, one or more organic additives can be provided during plating of the first via portion 402 to improve filling, and the additive may not be used in the second 424 conductive via portion. In other embodiments, the organic or other additives may be provided for both the first 402 and second 424 via portions, but the first via portion 402 may have higher concentrations of impurities left by the additives after plating. As explained herein, impurities such as sulfur, oxygen, carbon, or nitrogen may be present in the TSVs 410 in higher concentrations in the first via portion 402 as compared to the second via portion 424. In some embodiments, the non-copper elements, including alloying elements and impurities from additives, composition in the first conductive via portion 402 is higher than those in the second conductive via portion 424. For example, in some embodiments, the second conductive via portion 424 can have at least 5% less, at least 10% less, at least 15% less, or at least 20% less of the non-copper elements, as compared to the first conductive via portion 402. The composition and grain structure of the first conductive portion 402 can be the result of processing selected to optimize filling of deep, high aspect ratio vias, wherein the composition and grain structure of the second conductive portion 424 can be selected to optimize subsequent direct hybrid bonding.

As shown in FIG. 4I, a dielectric layer 418 can be disposed on the bulk semiconductor portion 404, with the second 424 conductive via portion extending through the dielectric layer 418 such that an end of the second conductive via portion 424 is flush with an upper surface of the dielectric layer 418, or is slightly recessed relative to the upper surface of the dielectric layer 418, e.g., by less than about 40 nm, by less than about 30 nm, by less than about 20 nm, by less than about 10 nm, or by less than about 5 nm. The dielectric layer 418 can include a planarized dielectric bonding layer configured for direct bonding to another element. The dielectric layer 418 can further comprise a dielectric barrier layer on the bulk semiconductor portion 404, the planarized dielectric bonding layer disposed on the dielectric barrier layer. A first lining barrier layer 412 can extend along a sidewall 411 of the first 402 and second 424 conductive portions. As shown, the second barrier layer 440 can include a second portion 442 extending along the first barrier layer 412 between the first barrier layer 412 and the second conductive via portion 424. Thus, the overall barrier thickness is greater between the second conductive portion 424 and the bulk substrate 404, as compared to that between the first conductive portion 402 and the bulk substrate 404, and may include two identifiable barrier layers, which may or may not have different compositions.

Figure 5A:
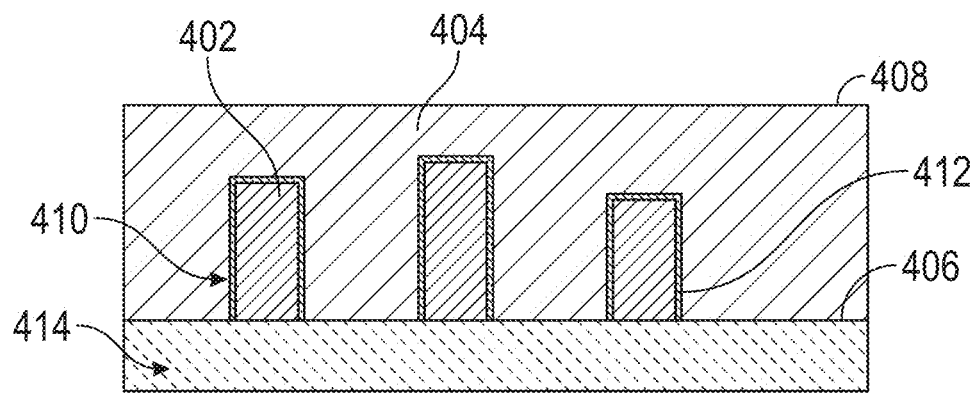
FIGS. 5A-I illustrate a method for forming a microelectronic structure, according to various embodiments.
Figure 5B:
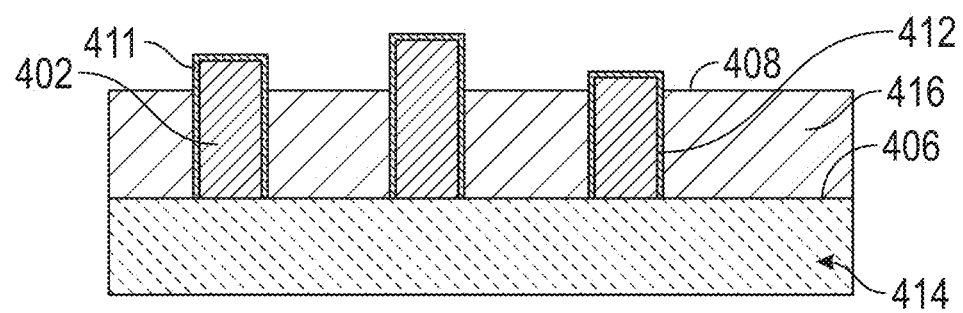
Figure 5C:
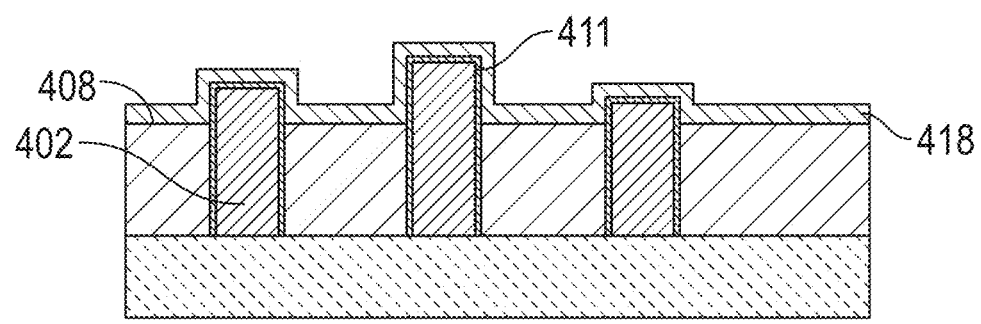
Figure 5D:
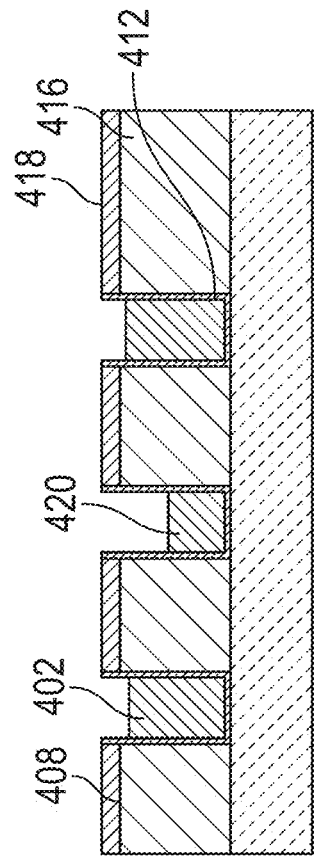
Figure 5E:
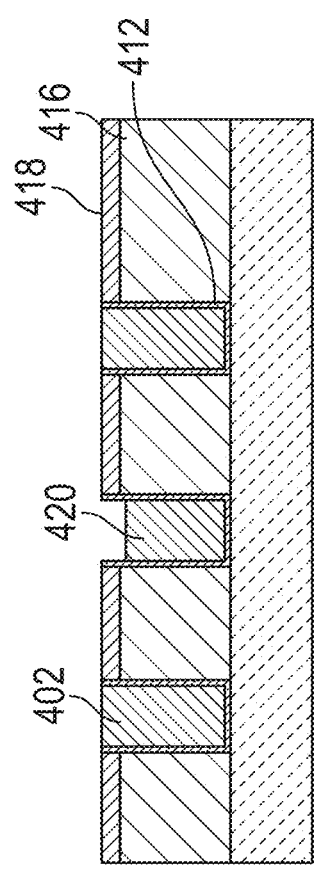
Figure 5F:
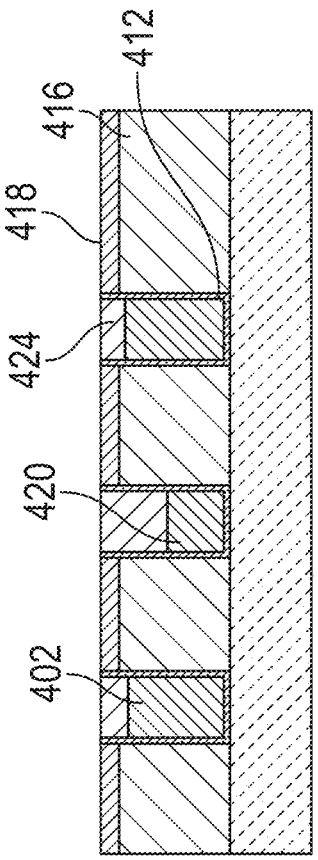

FIGS. 5A-5I illustrate a method for forming a microelectronic structure, according to another embodiment. Unless otherwise noted, the embodiment of FIGS. 5A-5I may be the same as or generally similar to like components of FIGS. 4A-4I. For example, the steps of FIGS. 5A-5E may be the same as those set forth above in connection with FIGS. 4A-4E. In FIG. 5F, however, there may not be a barrier layer provided over the first conductive via portion 410. Rather, the second conductive via portion 424 may be plated directly onto the first conductive via portion 410, or onto an intervening seed layer only, and the bulk semiconductor portion 416 without an intervening barrier layer. As explained above, the structure of FIG. 5F may be annealed, which can promote copper grain growth that is conducive to direct bonding.

In various embodiments, the buried conductive material of the first conductive via portion 402 may be more constrained than the upper portions of conductive material of the second conductive via portion 424. During annealing, the first 402 and second 424 conductive via portions can form different metal textures and/or have different concentrations of non-copper elements, such as alloying elements and/or impurities from plating additives. For example, a first metal texture of the first conductive via portion 402 can be different from a second metal texture of the second conductive via portion 424. In various embodiments, including the embodiments disclosed in FIGS. 4A-4I and 5A-5I, the crystal structure of the second conductive via portion 424 can have grains oriented vertically along a 111 crystal plane non-parallel to, e.g., generally perpendicular to, the bond interface to enhance metal diffusion, e.g., copper diffusion, during direct bonding. The grains can have geometric components that are generally perpendicular to the bond interface. In some embodiments, the first 402 and second 424 conductive via portions can comprise different metals or different alloys. For example, in some embodiments, the first conductive via portion 402 can comprise a copper alloy, and the second conductive via portion 424 can comprise substantially pure copper.

Figure 5G:
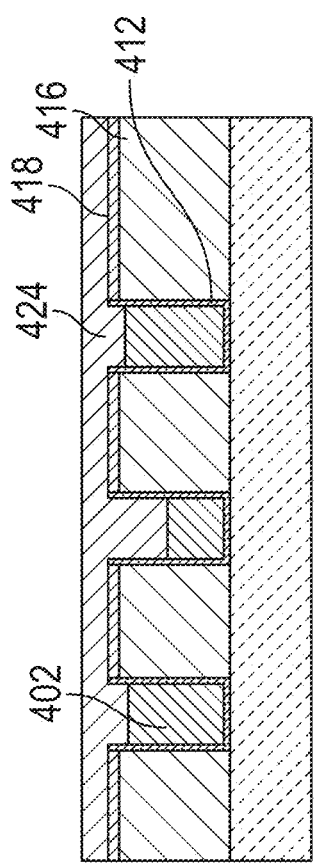
Figure 5H:
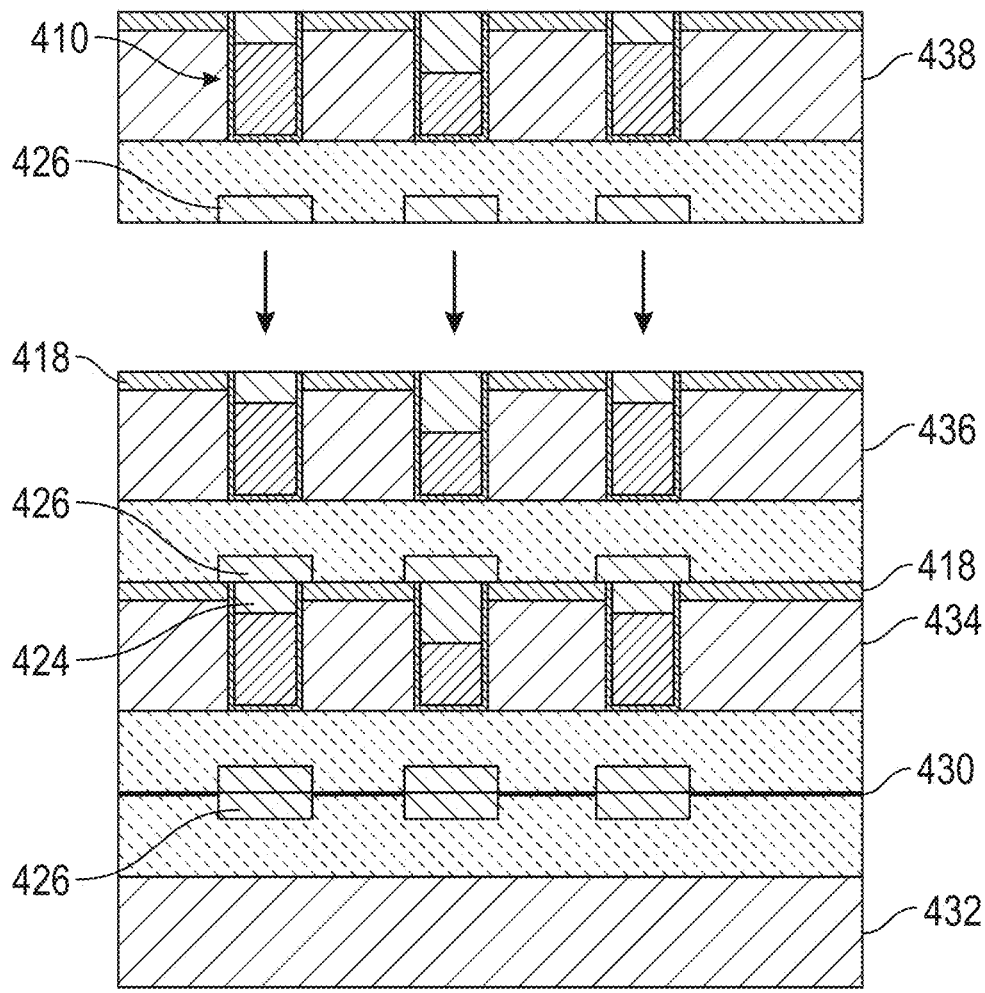
Figure 5I:
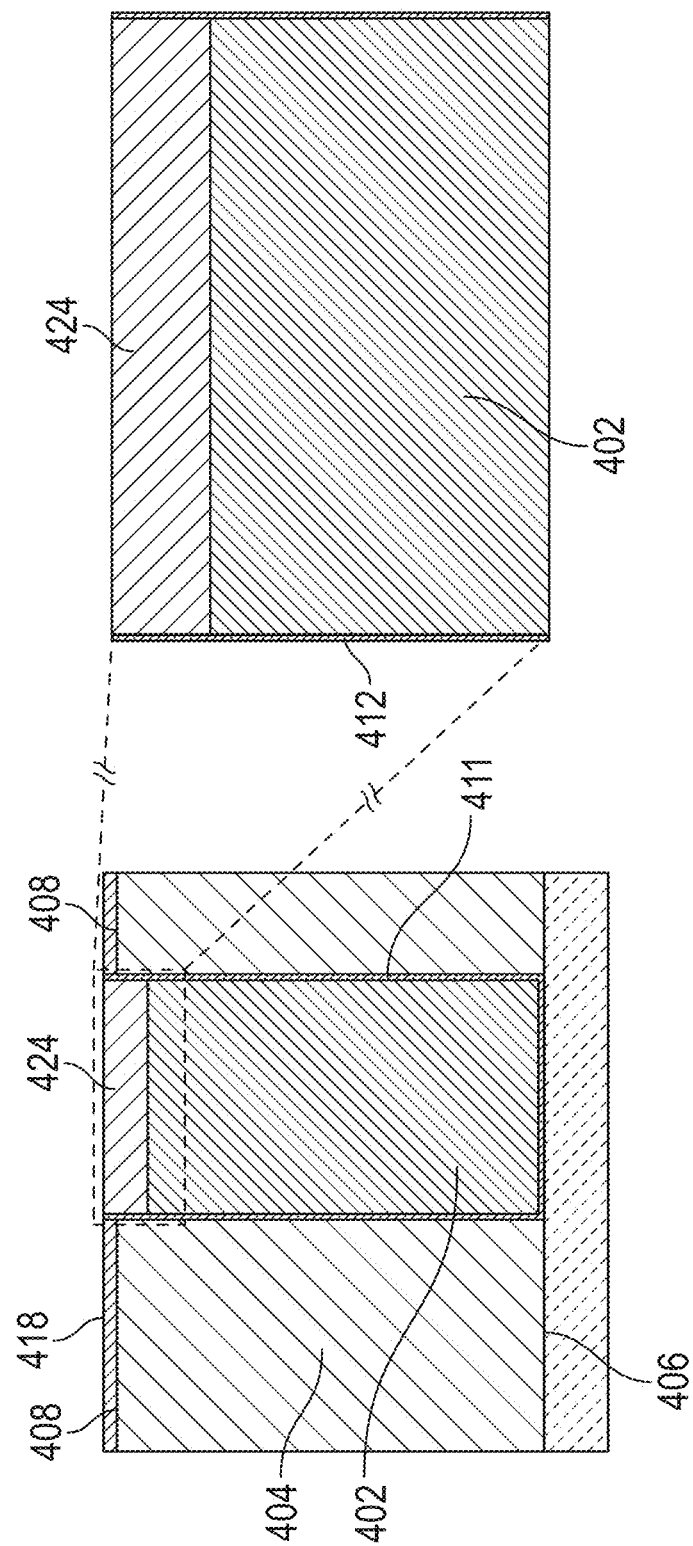

FIGS. 5G and 5H may be generally similar to the steps set forth in FIGS. 4G and 4H. FIG. 5I illustrates the microelectronic structure without the intervening barrier layer of FIG. 4I. As shown in FIG. 5I, the second conductive via portion 424 can be formed after and separately from the first conductive via portion 402. Unlike in FIG. 4I, there is no intervening barrier layer 440 between the first conductive via portion 402 and the second conductive vial portion 424.

Figure 6A:
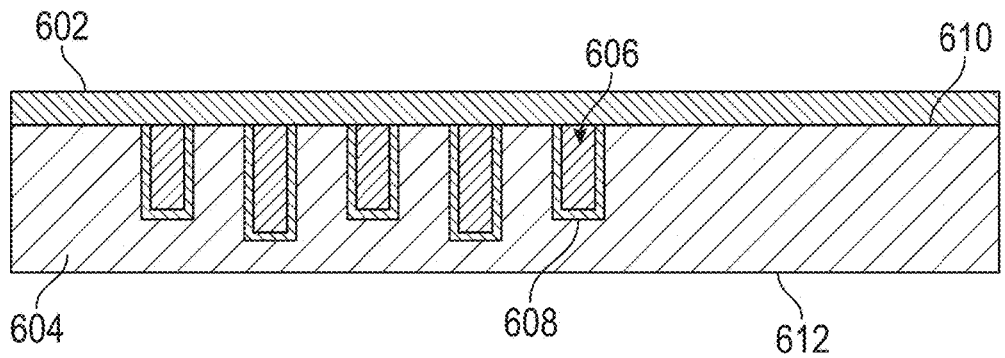
FIGS. 6A-6H illustrate a method for forming a microelectronic structure, according to various embodiments.

FIGS. 6A-6H illustrate another embodiment that enables the formation of conductive vias 606 having generally uniform lengths, while avoiding degradation of the vias 606, e.g., copper vias or other suitable conductive metal, and/or contamination of the semiconductor portion 604, e.g., silicon or other suitable semiconductor. Unless otherwise noted, the components of FIGS. 6A-6H may be generally similar to the components of FIGS. 4A-5I. For example, as explained above, and as shown in FIG. 6A, a semiconductor element 604, e.g., a semiconductor wafer, can have a plurality of conductive vias 606 formed in a semiconductor portion 604, e.g., a silicon bulk or device portion. The front side of the bulk semiconductor 610 is shown facing upwardly, and the opposite back side of the bulk semiconductor 612 is shown facing downwardly. In various embodiments, the front side 610 can comprise an active side of the semiconductor element, such that active circuitry can be formed at or near the front side 610. A dielectric liner and/or a barrier layer 608 can line the openings in which the vias 606 are disposed. One or more frontside dielectric layer(s) 602 can be provided over the front side of the semiconductor portion 610. Although FIG. 6A schematically illustrates the layer 602 as a single layer, it should be appreciated that the layer 602 can comprise multiple layers or sub-layers. The frontside dielectric layer(s) 602 can comprise any suitable type of dielectric material(s), including, e.g., silicon oxide, silicon nitride, silicon oxynitride, silicon oxycarbonitride, diamond-like carbon (DLC), and any other suitable dielectric material.

As explained above, the depth of the openings in which the conductive via 606 material is deposited, e.g., electroplated, may vary which can lead to the formation of vias having non-uniform lengths. The lack of uniformity can make it challenging to reveal the vias from the back side of the semiconductor element 612. Indeed, the etch variation of the via openings 606 can be on the order of 2-3 microns or more, such that there may be a 50% or more variation in TSV heights. In the process of FIGS. 4B and 5B, the semiconductor portion 604 is dry etched to expose the vias 606, which may protrude above the semiconductor material 604 at different heights. However, dry etching a semiconductor material 604 such as silicon with an etchant such as $SF_6$ may cause severe erosion of the copper via material, particularly if the dielectric liner and/or the lining barrier layer 608 are etched before the via 606 is adequately revealed. Moreover, processing of the conductive vias 606, e.g., by CMP, grinding, and other processing methods, may cause some of the conductive material of the via, e.g., copper material, to contaminate the semiconductor portion 604, e.g., silicon.

Figure 6B:
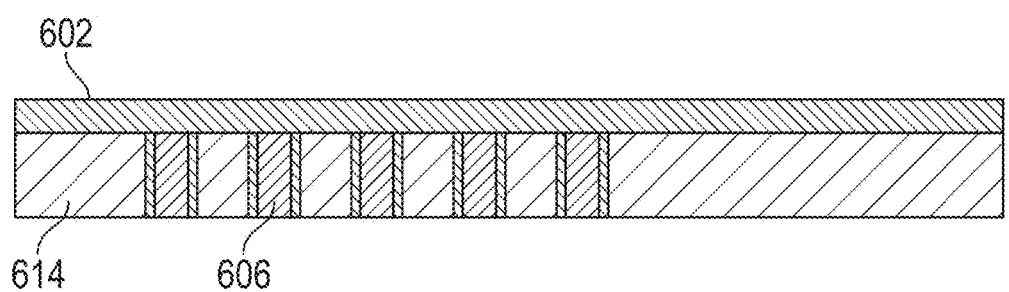

Accordingly, unlike the process of FIGS. 4B and 5B, in FIG. 6B, the back side of the semiconductor portion 612 can be grinded and polished, e.g., with CMP, to reveal the vias 606. The grinding and polishing processes can uniformly reveal the conductive vias 606, which can accommodate for the non-uniform lengths of the vias 606 before grinding and polishing. For example, the back side of the semiconductor element 612 can be grinded and polished until all of the vias 606 are revealed at the planarized, grinded and polished back side of the semiconductor element 614. Accordingly, in the illustrated embodiment, the grinding and polishing processes can be used to reveal vias 606 having a generally uniform length. In other embodiments, such as those described above in connection with FIGS. 4A-5I, it may not be desirable to utilize CMP to reveal the vias 606, since exposing the vias 606, which can comprise copper among other materials, to CMP may contaminate the semiconductor portion, e.g., silicon. In such embodiments, as explained above, an etch process, e.g., an $SF_6$ etch, can be used to initially reveal the vias 606.

Figure 6C:
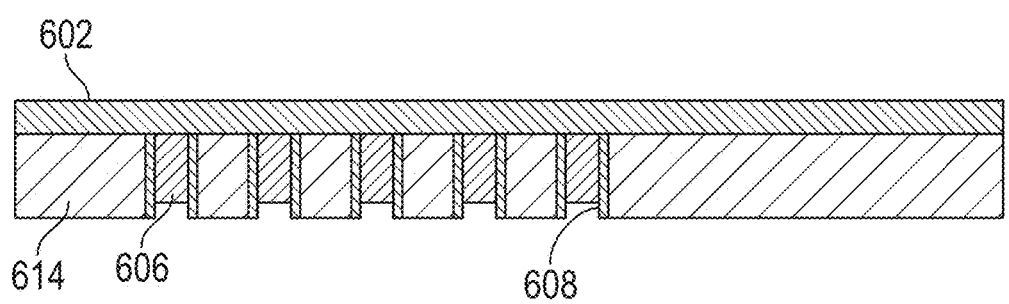
Figure 6D:
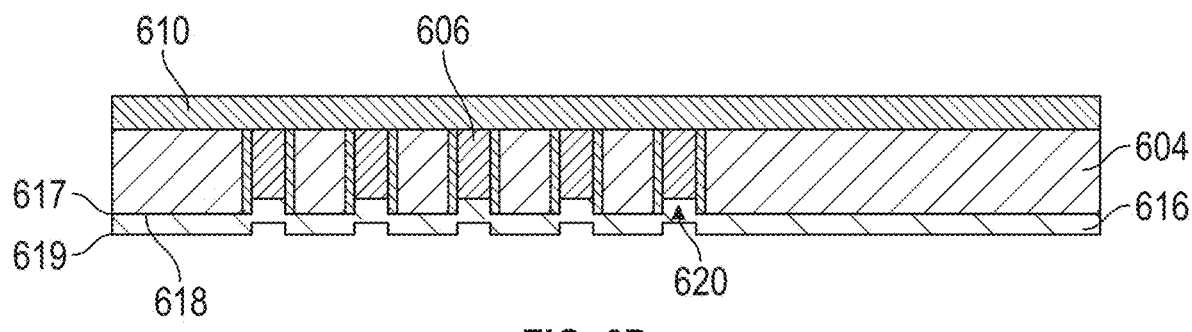

Turning to FIG. 6C, the conductive via 606 can be etched from the backside 614 to form an etched recess in the conductive material, which can comprise copper. For example, the conductive material can be etched at a depth in a range of 0.25 microns to 3 microns, in a range of 0.5 microns to 3 microns, e.g., about 1 micron in an embodiment. In FIG. 6D, a first backside dielectric layer 616 can be provided, e.g., deposited, over the grinded and polished back side of the semiconductor portion 618 and into the etched recesses formed in the vias 620. As shown, the first backside dielectric layer 616 can extend within the recesses over the copper vias and abutting the dielectric liner and/or barrier layers disposed in the openings 620. In some embodiments, the first backside dielectric layer 616 can comprise a plurality of layers. For example, in the illustrated embodiment, the first backside dielectric layer 616 can comprise a first dielectric layer 617, e.g., a low temperature silicon nitride dielectric layer, disposed on the back side of the semiconductor portion and on the vias 606 and a second dielectric layer 619, e.g., a low temperature silicon oxide dielectric layer, over the first dielectric layer 617. For example, in various embodiments, the first 617 and/or second 619 dielectric layers can be formed using a low-temperature chemical vapor deposition (CVD) process. In other embodiments, however, the first backside dielectric layer 616 can comprise only a single dielectric layer, or more than two dielectric layers.

Figure 6E:
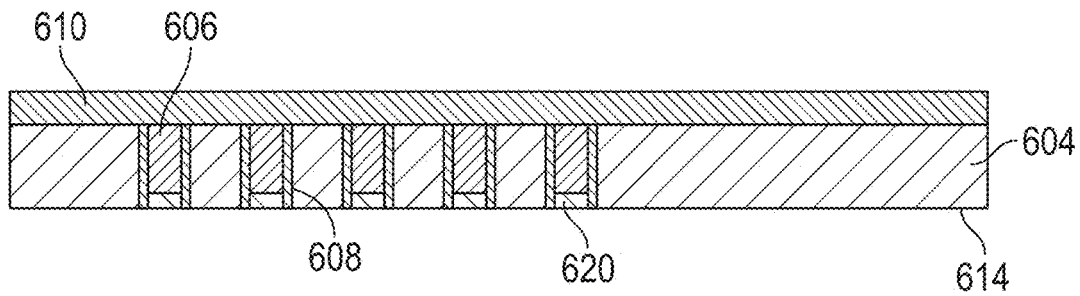
Figure 6F:
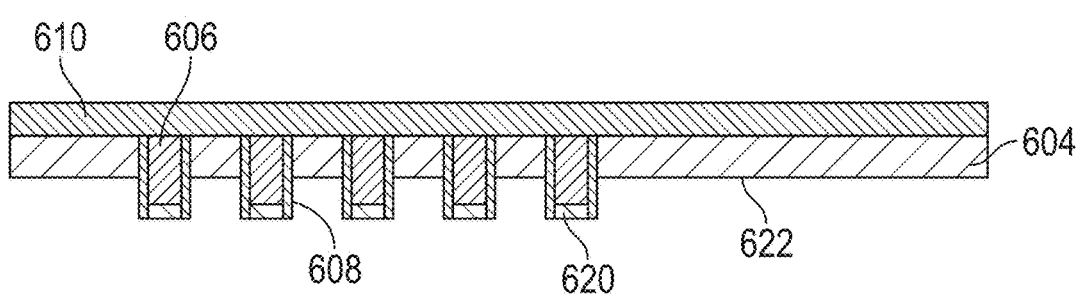

Turning to FIG. 6E, the back side of the semiconductor element 614 can be polished (e.g., with CMP) to remove first portions of the first backside dielectric layer 616 that overlie the semiconductor portion 604 so as to expose the semiconductor portion 604. Second portions of the first backside dielectric layer 620 may remain disposed in the recess over the conductive vias 606 as shown in FIG. 6E. The remaining second portion of the first backside dielectric layer 620 may serve to protect the conductive via material during a subsequent dry etch of the semiconductor portion 604, shown in FIG. 6F. The dry etch of FIG. 6F can accordingly uniformly reveal the vias 606, and the second portion of the first backside dielectric layer 620 can serve to protect the copper of the vias during the dry etch, e.g., using $SF_6$. Further, the step of FIG. 6F can use an etchant, e.g., $SF_6$, that is highly selective to silicon over the first backside dielectric layer 620, which can include silicon oxide at the exposed surface. As shown after the dry etch of FIG. 6F, therefore, the vias 606, first portion of the first backside dielectric layer 620, and dielectric liner/barrier layers 608 can protrude relative to an etched surface at the back side of the semiconductor portion 604. In various embodiments, the vias can protrude by an amount in a range of 3 microns to 4 microns.

Figure 6G:
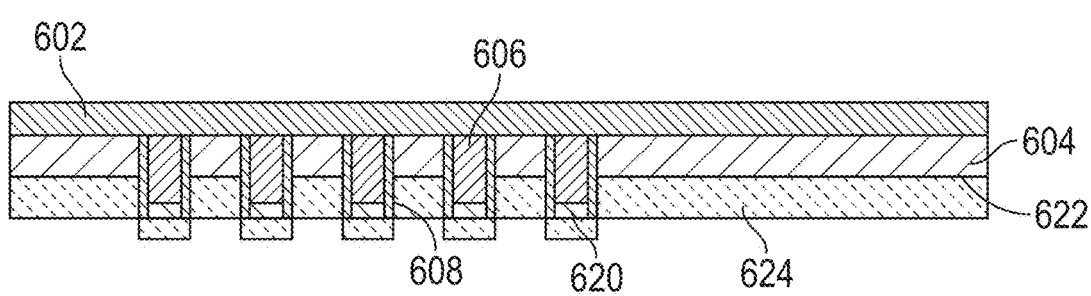

Turning to FIG. 6G, a second backside dielectric layer(s) 624 can be provided, e.g., deposited over the etched surface 622 of the semiconductor portion 604, along sidewalls of the exposed lining layers of the vias 606, over end portions of the lining layers 608, and over the second portions of the first backside dielectric layer 620. In some embodiments, the second backside dielectric layer 624 can comprise a plurality of layers. For example, in the illustrated embodiment, the second backside dielectric layer can comprise a first dielectric layer 625, e.g., a low temperature silicon nitride dielectric layer, disposed on the etched surface of the semiconductor portion 622 and on the second portion of the first backside dielectric layer 620 and a second dielectric layer 627, e.g., a low temperature silicon oxide dielectric layer, over the first dielectric layer 625. In other embodiments, however, the second backside dielectric layer 624 can comprise only a single dielectric layer, or more than two dielectric layers. A thickness of the second backside dielectric layer 624 can be any suitable thickness, e.g., in a range of 4 microns to 5 microns in various embodiments. Beneficially, a thickness of one or both of the first 625 and second 627 backside dielectric layer(s) can be selected so as to provide adequate support or stress compensation, particularly for thinned dies.

Figure 6H:
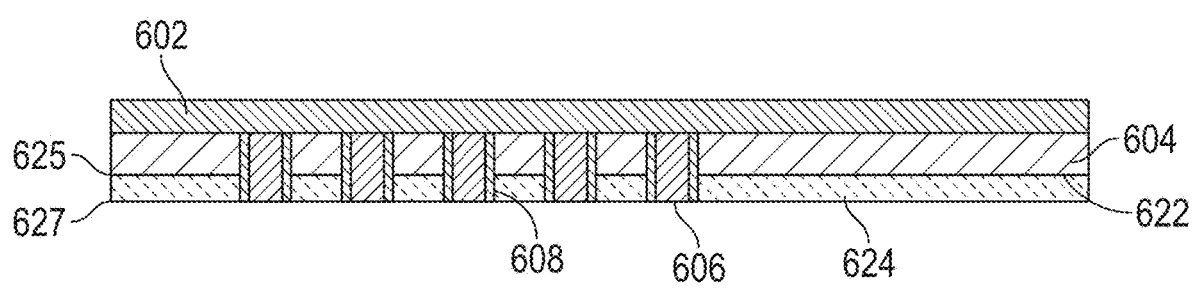

As shown in FIG. 6H, the back side of the semiconductor element can be polished (e.g., with CMP) to expose the vias 606. In particular, the polishing can remove portions of the second backside dielectric layer 624 that are disposed over the first backside dielectric layer 616, the remaining second portion of the first backside dielectric layer 620, and can thin the portion of the second backside layer that overlie the semiconductor portion. Thus, in the structure of FIG. 6H, the second backside dielectric layer 624 can be disposed over the etched surface 622 of the semiconductor portion 604 and can about the via lining layer(s) 608, e.g., the lining dielectric layer and/or lining barrier layer. In various embodiments, the polishing can also serve to recess the conductive material within the via 606 relative to the second backside dielectric 624 layer so as to prepare the back side of the semiconductor element for direct bonding. In various embodiments, the polishing can recess the conductive material by an amount in a range of 1 nm to 20 nm, or in a range of 1 nm to 10 nm. As explained above, the semiconductor element can be directly bonded and/or stacked to another element. The frontside dielectric layer(s) 602 can also be removed to expose the vias 606 at the front side, and one or more additional elements can be stacked on and directly bonded to the front side of the semiconductor element.

Examples of Direct Bonding Methods and Directly Bonded Structures

Various embodiments disclosed herein relate to directly bonded structures in which two elements can be directly bonded to one another without an intervening adhesive. Two or more semiconductor elements, such as integrated device dies, wafers, and other semiconductor elements, may be stacked on or bonded to one another to form a bonded structure. Conductive contact pads of one element may be electrically connected to corresponding conductive contact pads of another element. Any suitable number of elements can be stacked in the bonded structure.

In some embodiments, the elements are directly bonded to one another without an adhesive. In various embodiments, a non-conductive or dielectric material of a first element can be directly bonded to a corresponding non-conductive or dielectric field region of a second element without an adhesive. The non-conductive material can be referred to as a nonconductive bonding region or bonding layer of the first element. In some embodiments, the non-conductive material of the first element can be directly bonded to the corresponding non-conductive material of the second element using dielectric-to-dielectric bonding techniques. For example, dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes.

In various embodiments, hybrid direct bonds can be formed without an intervening adhesive. For example, dielectric bonding surfaces can be polished to a high degree of smoothness. The bonding surfaces can be cleaned and exposed to a plasma and/or etchants to activate the surfaces. In some embodiments, the surfaces can be terminated with a species after activation or during activation, e.g., during the plasma and/or etch processes. Without being limited by theory, in some embodiments, the activation process can be performed to break chemical bonds at the bonding surface, and the termination process can provide additional chemical species at the bonding surface that improves the bonding energy during direct bonding. In some embodiments, the activation and termination are provided in the same step, e.g., a plasma or wet etchant to activate and terminate the surfaces. In other embodiments, the bonding surface can be terminated in a separate treatment to provide the additional species for direct bonding. In various embodiments, the terminating species can comprise nitrogen. Further, in some embodiments, the bonding surfaces can be exposed to fluorine. For example, there may be one or multiple fluorine peaks near layer and/or bonding interfaces. Thus, in some embodiments, in the directly bonded structures, the bonding interface between two dielectric materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contact pads of the first element can also be directly bonded to corresponding conductive contact pads of the second element. For example, a hybrid bonding technique can be used to provide conductor-to-conductor direct bonds along a bond interface that includes covalently direct bonded dielectric-to-dielectric surfaces, prepared as described above. In various embodiments, the conductor-to-conductor, e.g., contact pad to contact pad, direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, dielectric bonding surfaces can be prepared and directly bonded to one another without an intervening adhesive as explained above. Conductive contact pads, which may be surrounded by nonconductive dielectric field regions, may also directly bond to one another without an intervening adhesive. In some embodiments, the respective contact pads can be recessed below exterior (e.g., upper) surfaces of the dielectric regions or nonconductive bonding regions, for example, recessed by less than 30 nm, less than 20 nm, less than 15 nm, or less than 10 nm, for example, recessed in a range of 2 nm to 20 nm, or in a range of 4 nm to 10 nm. The nonconductive bonding regions can be directly bonded to one another without an adhesive at room temperature in some embodiments and, subsequently, the bonded structure can be annealed. Upon annealing, the contact pads can expand and contact one another to form a metal-to-metal direct bond. Beneficially, the use of hybrid bonding techniques, such as Direct Bond Interconnect, or DBI®, available commercially from Xperi of San Jose, CA, can enable high density of pads connected across the direct bond interface, e.g., small or fine pitches for regular arrays.

In some embodiments, the pitch of the bonding pads, or conductive traces embedded in the bonding surface of one of the bonded elements, may be less than 40 microns or less than 10 microns or even less than 2 microns. For some applications the ratio of the pitch of the bonding pads to one of the dimensions of the bonding pad is less than 5, or less than 3 and sometimes desirably less than 2. In other applications the width of the conductive traces embedded in the bonding surface of one of the bonded elements may range between 0.3 to 3 microns. In various embodiments, the contact pads and/or traces can comprise copper, although other metals may be suitable.

Thus, in direct bonding processes, a first element can be directly bonded to a second element without an intervening adhesive. In some arrangements, the first element can comprise a singulated element, such as a singulated integrated device die. In other arrangements, the first element can comprise a carrier or substrate (e.g., a wafer) that includes a plurality, e.g., tens, hundreds, or more, of device regions that, when singulated, form a plurality of integrated device dies. Similarly, the second element can comprise a singulated element, such as a singulated integrated device die. In other arrangements, the second element can comprise a carrier or substrate (e.g., a wafer).

As explained herein, the first and second elements can be directly bonded to one another without an adhesive, which is different from a deposition process. In one application, a width of the first element in the bonded structure can be similar to a width of the second element. In some other embodiments, a width of the first element in the bonded structure can be different from a width of the second element. The width or area of the larger element in the bonded structure may be at least 10% larger than the width or area of the smaller element. The first and second elements can accordingly comprise non-deposited elements. Further, directly bonded structures, unlike deposited layers, can include a defect region along the bond interface in which nanovoids are present. The nanovoids may be formed due to activation of the bonding surfaces, e.g., exposure to a plasma. As explained above, the bond interface can include concentration of materials from the activation and/or last chemical treatment processes. For example, in embodiments that utilize a nitrogen plasma for activation, a nitrogen peak can be formed at the bond interface. In embodiments that utilize an oxygen plasma for activation, an oxygen peak can be formed at the bond interface. In some embodiments, the bond interface can comprise silicon oxynitride, silicon oxycarbonitride, or silicon carbonitride. As explained herein, the direct bond can comprise a covalent bond, which is stronger than van Der Waals bonds. The bonding layers can also comprise polished surfaces that are planarized to a high degree of smoothness.

In some embodiments, metal-to-metal bonds are formed between contact pads. In some embodiments, the contact pads comprise copper or a copper alloy. In various embodiments, the metal-to-metal bonds between the contact pads can be joined such that copper grains grow into each other across the bond interface. In some embodiments, the copper can have grains oriented along the 111 crystal plane for improved copper diffusion across the bond interface. The bond interface can extend substantially entirely to at least a portion of the bonded contact pads, such that there is substantially no gap between the nonconductive bonding regions at or near the bonded contact pads. In some embodiments, a barrier layer may be provided under the contact pads, e.g., which may include copper. In other embodiments, however, there may be no barrier layer under the contact pads, for example, as described in US 2019/0096741, which is incorporated by reference herein in its entirety and for all purposes.

In one embodiment, a microelectronic structure is disclosed. The microelectronic structure can include a bulk semiconductor portion having a first surface and a second surface opposite the first surface; and a via structure disposed in an opening extending at least partially through the bulk semiconductor portion along a direction non-parallel to the first surface, the via structure comprising a first conductive via portion, a second conductive via portion, a first barrier layer extending along a sidewall of the first conductive via portion, and a second barrier layer the second barrier layer including a first portion disposed between the first conductive via portion and the second conductive via portion, the second conductive via portion extending from the second barrier layer to at least the first surface.

In some embodiments, the microelectronic structure includes a dielectric layer on the bulk semiconductor portion, the second conductive via portion extending through the dielectric layer such that an end of the second conductive via portion is flush with or recessed from an upper surface of the dielectric layer. In some embodiments, the dielectric layer comprises a planarized dielectric bonding layer configured for direct bonding to another element. In some embodiments, the dielectric layer further comprises a dielectric barrier layer on the bulk semiconductor portion, the planarized dielectric bonding layer disposed on the dielectric barrier layer. In some embodiments, the second barrier layer includes a second portion extending along the first barrier layer between the first barrier layer and the second conductive via portion. In some embodiments, a first metal texture of the first conductive via portion is different from a second metal texture of the second conductive via portion. In some embodiments, the second metal texture has grains oriented along a 111 crystal plane non-parallel to a bond interface. In some embodiments, the first and second conductive via portions comprises copper, the copper of the first conductive via portion having an impurity material therein. In some embodiments, the first conductive via portion has a higher impurity concentration than the second conductive via portion. In some embodiments, the first conductive via portion further comprises one or more alloying elements including one or more of beryllium (Be), indium (In), gallium (Ga), manganese (Mn), and nickel (Ni). In some embodiments, the impurity material comprises one or more of sulfur, oxygen, carbon, or nitrogen. In some embodiments, the first and second conductive via portions comprise different metals or different alloys. In some embodiments, the second surface comprises an active surface including active integrated circuitry formed in or on the second surface. In some embodiments, the microelectronic structure is directly bonded to another element without an intervening adhesive. In some embodiments, an end surface of the second conductive via portion is directly bonded to a contact pad of the another element without an intervening adhesive. In some embodiments, nonconductive bonding regions of the microelectronic element and the another element are directly bonded without an intervening adhesive. In some embodiments, the microelectronic structure can include a second via structure having a first conductive via portion, a second conductive via portion, a first barrier layer extending along a sidewall of the first conductive via portion, and a second barrier layer, the second barrier layer including a first portion disposed between the first conductive via portion and the second conductive via portion, wherein the second conductive via portion of the via structure extends along a length different from a length of the second conductive via portion of the second via structure.

In another embodiment, a microelectronic structure is disclosed. The microelectronic structure can include a bulk semiconductor portion having a first surface and a second surface opposite the first surface; and a via structure disposed in an opening extending at least partially through the bulk semiconductor portion through the first surface along a direction non-parallel to the first surface, the via structure comprising a first conductive via portion and a second conductive via portion disposed directly onto and contacting the first conductive via portion without an intervening barrier layer, the second conductive via portion disposed between the first surface and the first conductive via portion, the first conductive via portion having a different material composition from the second conductive via portion.

In some embodiments, the microelectronic structure includes a barrier layer extending along a sidewall of the first and second conductive portions. In some embodiments, the microelectronic structure includes a dielectric layer on the bulk semiconductor portion, the second conductive via portion extending through the dielectric layer such that an end of the second conductive via portion is flush with or recessed below an upper surface of the dielectric layer. In some embodiments, the dielectric layer comprises a planarized dielectric bonding layer configured for direct bonding to another element. In some embodiments, the dielectric layer further comprises a dielectric barrier layer on the bulk semiconductor portion, the planarized dielectric bonding layer disposed on the dielectric barrier layer. In some embodiments, a first metal texture of the first conductive via portion is different from a second metal texture of the second conductive via portion. In some embodiments, the second metal texture has grains oriented along a 111 crystal plane. In some embodiments, the first and second conductive via portions comprises copper, the copper of the first conductive via portion having an impurity material therein. In some embodiments, the first conductive via portion comprises one or more alloying elements including one or more of beryllium (Be), indium (In), gallium (Ga), manganese (Mn), and nickel (Ni). In some embodiments, the impurity material comprises one or more of sulfur, oxygen, carbon, or nitrogen. In some embodiments, the first and second conductive via portions comprise different metals or different alloys. In some embodiments, the microelectronic device is directly bonded to another element without an intervening adhesive. In some embodiments, an end surface of the second conductive via portion is directly bonded to a contact pad of the another element without an intervening adhesive. In some embodiments, nonconductive bonding regions of the microelectronic element and the another element are directly bonded without an intervening adhesive.

In another embodiment, a microelectronic structure is disclosed. The microelectronic structure can include a bulk semiconductor portion having a first surface and a second surface opposite the first surface; and a via structure disposed in an opening extending at least partially through the bulk semiconductor portion through the first surface along a direction non-parallel to the first surface, the via structure comprising a first conductive via portion and a second conductive via portion disposed directly onto and contacting the first conductive via portion without an intervening barrier layer, the second conductive via portion disposed between the first surface and the first conductive via portion, the first conductive via portion being formed before, and separately from, the second conductive via portion.

In some embodiments, the microelectronic structure includes a barrier layer extending along a sidewall of the first and second conductive portions. In some embodiments, a first metal texture of the first conductive via portion is different from a second metal texture of the second conductive via portion. In some embodiments, the second metal texture has grains oriented along a 111 crystal plane. In some embodiments, the first metal texture has a first proportion of 111 planes oriented within 30° of vertical, wherein the second metal texture has a second proportion of 111 planes oriented within 30° of vertical, the second proportion greater than the first portion. In some embodiments, the first and second conductive via portions comprises copper, the copper of the first conductive via portion having an impurity material therein. In some embodiments, the first conductive portion has a higher percentage of alloying elements as compared to the second conductive via portion. In some embodiments, the microelectronic device is directly bonded to another element without an intervening adhesive. In some embodiments, an end surface of the second conductive via portion is directly bonded to a contact pad of the another element without an intervening adhesive. In some embodiments, nonconductive bonding regions of the microelectronic element and the another element are directly bonded without an intervening adhesive.

In another embodiment, a method of forming a microelectronic structure is disclosed. The method can include forming an opening at least partially through a substrate having a front surface and a back surface opposite the front surface, the opening extending through the front surface along a direction non-parallel to the second surface; providing a first conductive via portion in the opening from the front surface; revealing the first conductive via portion by removing material from the back surface; and after the revealing, providing a filling structure in the opening over the first conductive via portion from the back surface.

In some embodiments, providing the filling structure comprises providing a second conductive via portion in the opening over the first conductive via portion from the back surface. In some embodiments, the method includes after revealing, recessing the first conductive via portion from the back surface. In some embodiments, the method includes after providing the first conductive via portion but before providing the second conductive via portion, providing a second barrier layer over the first conductive via portion. In some embodiments, the method includes providing a first barrier layer along a sidewall of the first conductive via portion. In some embodiments, the method includes providing the first barrier layer before providing the first conductive via portion. In some embodiments, providing the second barrier layer comprises providing the second barrier layer along the first barrier layer between the first barrier layer and the second conductive via portion. In some embodiments, the method includes providing a dielectric layer on the bulk semiconductor portion, the dielectric layer at least partially defining the back surface of the substrate, the second conductive via portion extending through the dielectric layer such that an end of the second conductive via portion is flush with or recessed from the back surface of the substrate. In some embodiments, the method includes preparing the dielectric layer for direct bonding to another element. In some embodiments, the method includes providing a dielectric barrier layer on the bulk semiconductor portion, the dielectric bonding layer disposed on the dielectric barrier layer. In some embodiments, the method includes directly bonding the dielectric layer to another element without an intervening adhesive. In some embodiments, the method includes directly bonding an end surface of the second conductive via portion to a contact pad of another element without an intervening adhesive. In some embodiments, providing the filling structure comprises providing a dielectric layer in a recess over the first conductive via portion. In some embodiments, the method can include removing a portion of the substrate from the back surface such that the first conductive via portion protrudes from the back surface of the substrate, and removing the dielectric layer to expose the conductive via. In some embodiments, removing the portion of the substrate comprises etching the back surface of the substrate. In some embodiments, the method can include providing a second backside dielectric layer over at least the etched back surface of the substrate and a portion of the dielectric layer disposed in the recess. In some embodiments, the method can include removing at least portions of the second backside dielectric layer that overlie the portion of the dielectric layer disposed in the recess. In some embodiments, the method can include planarizing the second backside dielectric layer and recessing the first conductive via portion relative to the second backside dielectric layer.

In another embodiment, a method of forming a microelectronic structure is disclosed. The method can include forming an opening partially through a substrate having a front surface and a back surface opposite the first surface, the opening extending through the front surface along a direction non-parallel to the front surface; filling the opening with a first conductive via portion; revealing the first conductive via portion by removing material from the back surface; and refilling a portion of the opening with a filling structure after revealing the first conductive portion.

In some embodiments, refilling the portion of the opening with the filling structure comprises providing a second conductive via portion in the opening over the first conductive via portion from the back surface. In some embodiments, the method includes recessing the first conductive portion after revealing to define the portion of the opening. In some embodiments, the method includes depositing a second barrier layer on the first conductive via portion after recessing and before refilling. In some embodiments, the method includes depositing a first barrier layer to line the opening prior to filling. In some embodiments, depositing the second barrier layer comprises depositing the second barrier layer on the first barrier layer in the portion of the opening. In some embodiments, refilling the portion of the opening with the filling structure comprises providing a dielectric layer in a recess over the first conductive via portion. In some embodiments, the method can include removing a portion of the substrate from the back surface such that the first conductive via portion protrudes from the back surface of the substrate, and removing the dielectric layer to expose the conductive via. In some embodiments, removing the portion of the substrate comprises etching the back surface of the substrate. In some embodiments, the method can include providing a second backside dielectric layer over at least the etched back surface of the substrate and a portion of the dielectric layer disposed in the recess. In some embodiments, removing at least portions of the second backside dielectric layer that overlie the portion of the dielectric layer disposed in the recess. In some embodiments, the method can include planarizing the second backside dielectric layer and recessing the first conductive via portion relative to the second backside dielectric layer.

In another embodiment, a bonded structure is disclosed. The bonded structure can include a first element having a first bonding surface and a second element having a second bonding surface, the first element having a third surface opposite the first bonding surface; and a via structure disposed in an opening extending at least partially through the first element from the first bonding surface along a direction non-parallel to the first bonding surface, the via structure comprising a first conductive via portion and a second conductive via portion contacting one another, the second conductive via portion at least partially embedded within a bonding material at the bonding surface of the first element, the bonding material and the second conductive via portion directly bonded to the bonding surface of the second element without an intervening adhesive. In some embodiments, nonconductive bonding regions of the first and second elements are directly bonded without an intervening adhesive.

In another embodiment, a method of forming a microelectronic structure is disclosed. The method an include: providing a substrate having an opening and a conductive via disposed in the opening, the conductive via extending partially through the substrate from a first side of the substrate towards the second side; removing a portion of the substrate from the second side to expose the conductive via; removing a portion of the conductive via from the second side of the substrate to form a recess; providing a dielectric layer in the recess over the conductive via; further removing a portion of the substrate from the second side such that the conductive via protrudes from the second side of the substrate; and removing the dielectric layer to expose the conductive via.

In some embodiments, removing the portion of the substrate comprises at least one of grinding and polishing the second side. In some embodiments, at least one of grinding and polishing comprises planarizing the substrate and the conductive via. In some embodiments, removing the portion of the conductive via comprises etching the conductive via. In some embodiments, providing the dielectric layer comprises providing a first backside dielectric layer over the back side of the substrate and in the recess. In some embodiments, providing the first backside dielectric layer comprises providing a plurality of dielectric layers. In some embodiments, providing the plurality of dielectric layers comprises providing a first silicon nitride layer over the back side of the substrate and over the conductive via and providing a second silicon oxide layer over the first silicon nitride layer. In some embodiments, the method can include, before further removing the portion of the substrate, removing a portion of the first backside dielectric layer that is disposed over the back side of the substrate. In some embodiments, further removing the portion of the substrate comprises etching the back side of the substrate. In some embodiments, the method can include providing a second backside dielectric layer over at least the etched back side of the substrate and a portion of the first backside dielectric layer disposed in the recess. In some embodiments, the method can include removing at least portions of the second backside dielectric layer that overlie the portion of the first backside dielectric layer disposed in the recess. In some embodiments, the method can include planarizing the second backside dielectric layer and recessing the conductive via relative to the second backside dielectric layer.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A microelectronic structure comprising:
   a back side and a front side opposite the back side;
   a bulk semiconductor portion having a back surface and a front surface opposite the back surface, wherein the front surface comprises an active surface including active integrated circuitry formed in or on the front surface; and
   a via structure disposed in an opening extending at least partially through the bulk semiconductor portion through the back surface along a direction non-parallel to the back surface, the via structure comprising a first conductive via portion, a second conductive via portion, a first barrier layer extending along a sidewall of the first conductive via portion, and a second barrier layer the second barrier layer including a first portion disposed between the first conductive via portion and the second conductive via portion, the second conductive via portion overlying the first conductive via portion and extending from the second barrier layer to at least the back surface, wherein an end of the second conductive via portion defines a portion of the back side of the microelectronic structure, and wherein the end of the second conductive via portion serves as a contact pad configured for direct bonding to a corresponding conductive feature of another element.

2. The microelectronic device of claim 1, further comprising a dielectric layer on the back surface of the bulk semiconductor portion, the second conductive via portion extending through the dielectric layer such that the end of the second conductive via portion is flush with or recessed from an upper surface of the dielectric layer.

3. The microelectronic device of claim 2, wherein the dielectric layer comprises a planarized dielectric bonding layer configured for direct bonding to another element.

4. The microelectronic device of claim 3, wherein the dielectric layer further comprises a dielectric barrier layer on the bulk semiconductor portion, the planarized dielectric bonding layer disposed on the dielectric barrier layer.

5. The microelectronic device of claim 1, wherein the second barrier layer includes a second portion extending along the first barrier layer between the first barrier layer and the second conductive via portion.

6. The microelectronic device of claim 1, wherein a first metal texture of the first conductive via portion is different from a second metal texture of the second conductive via portion.

7. The microelectronic device of claim 6, wherein the second metal texture has grains oriented along a 111 crystal plane non-parallel to a bond interface.

8. The microelectronic device of claim 1, wherein the first and second conductive via portions comprises copper, the copper of the first conductive via portion having an impurity material therein.

9. The microelectronic device of claim 8, wherein the first conductive via portion has a higher impurity concentration than the second conductive via portion.

10. The microelectronic device of claim 8, wherein the first conductive via portion further comprises one or more alloying elements including one or more of beryllium (Be), indium (In), gallium (Ga), manganese (Mn), and nickel (Ni).

11. The microelectronic device of claim 8, wherein the impurity material comprises one or more of sulfur, oxygen, carbon, or nitrogen.

12. The microelectronic device of claim 1, wherein the first and second conductive via portions comprise different metals or different alloys.

13. A bonded structure comprising the microelectronic device of claim 1, wherein the microelectronic device is directly bonded to another element without an intervening adhesive.

14. The bonded structure of claim 13, wherein nonconductive bonding regions of the microelectronic element and the another element are directly bonded without an intervening adhesive.

15. A microelectronic structure comprising:
a back side and a front side opposite the back side;
a bulk semiconductor portion having a back surface and a front surface opposite the back surface, wherein the front surface comprises an active surface having active circuitry formed therein or thereon; and
a via structure disposed in an opening extending at least partially through the bulk semiconductor portion through the back surface along a direction non-parallel to the back surface, the via structure comprising a first conductive via portion and a second conductive via portion disposed directly onto and contacting the first conductive via portion without an intervening barrier layer, the second conductive via portion disposed between the back surface and the first conductive via portion and overlying the first conductive via portion, the first conductive via portion having a different material composition from the second conductive via portion, wherein an end of the second conductive via portion defines a portion of the back side of the microelectronic structure, and wherein the end of the second conductive via portion serves as a contact pad configured for direct bonding to a corresponding conductive feature of another element.

16. The microelectronic device of claim 15, further comprising a barrier layer extending along a sidewall of the first and second conductive portions.

17. The microelectronic device of claim 15, further comprising a dielectric layer on the back surface of the bulk semiconductor portion, the dielectric layer defining another portion of the back side of the microelectronic structure, the second conductive via portion extending through the dielectric layer such that the end of the second conductive via portion is flush with or recessed below an upper surface of the dielectric layer.

18. The microelectronic device of claim 15, wherein the first and second conductive via portions comprises copper, the copper of the first conductive via portion having an impurity material therein.

19. The microelectronic device of claim 18, wherein the first conductive via portion comprises one or more alloying elements including one or more of beryllium (Be), indium (In), gallium (Ga), manganese (Mn), and nickel (Ni).

20. The microelectronic device of claim 18, wherein the impurity material comprises one or more of sulfur, oxygen, carbon, or nitrogen.

21. The microelectronic device of claim 15, wherein the first and second conductive via portions comprise different metals or different alloys.

22. A bonded structure comprising the microelectronic device of claim 15, wherein the back side of the microelectronic device is directly bonded to another element without an intervening adhesive.

23. A microelectronic structure comprising:
a bulk semiconductor portion having a back surface and a front surface opposite the back surface, wherein the front surface comprises an active surface having active circuitry formed therein or thereon; and
a via structure disposed in an opening extending at least partially through the bulk semiconductor portion through the back surface along a direction non-parallel to the back surface, the via structure comprising a first conductive via portion and a second conductive via portion disposed directly onto and contacting the first conductive via portion without an intervening barrier layer, the second conductive via portion disposed between the back surface and the first conductive via portion and overlying the first conductive via portion, the first conductive via portion being formed before, and separately from, the second conductive via portion, wherein an end surface of the second conductive via portion defines a portion of a back side of the microelectronic structure and serves as a contact pad configured for direct bonding to a corresponding conductive feature of another element.

24. The microelectronic device of claim 23, further comprising a barrier layer extending along a sidewall of the first and second conductive portions.

25. The microelectronic device of claim 23, wherein a first metal texture of the first conductive via portion is different from a second metal texture of the second conductive via portion.

26. The microelectronic device of claim 25, wherein the second metal texture has grains oriented along a 111 crystal plane.

27. The microelectronic device of claim 26, wherein the first metal texture has a first proportion of 111 planes oriented within 30° of vertical, wherein the second metal texture has a second proportion of 111 planes oriented within 30° of vertical, the second proportion greater than the first portion.

28. The microelectronic device of claim 23, wherein the first and second conductive via portions comprises copper, the copper of the first conductive via portion having an impurity material therein.

29. The microelectronic device of claim 23, wherein the first conductive portion has a higher percentage of alloying elements as compared to the second conductive via portion.

30. A bonded structure comprising the microelectronic device of claim 23, wherein the microelectronic device is directly bonded to another element without an intervening adhesive.

31. The bonded structure of claim 30, wherein the end surface of the second conductive via portion is directly bonded to a contact pad of the another element without an intervening adhesive.

32. The bonded structure of claim 30, wherein nonconductive bonding regions of the microelectronic element and the another element are directly bonded without an intervening adhesive.

33. A bonded structure comprising the microelectronic device of claim 15, wherein the microelectronic device is hybrid bonded to another element without an intervening adhesive,
   wherein a dielectric layer on the back surface of the bulk semiconductor portion of the microelectronic device is directly bonded to a dielectric material on the element without an intervening adhesive, and
   wherein the second via portion is directly bonded to a conductive feature on the element without an intervening adhesive.

* * * * *

UNITED STATES PATENT AND TRADEMARK OFFICE
CERTIFICATE OF CORRECTION

| | | |
|---|---|---|
| PATENT NO. | : 12,456,662 B2 | Page 1 of 1 |
| APPLICATION NO. | : 17/646135 | |
| DATED | : October 28, 2025 | |
| INVENTOR(S) | : Gaius Gillman Fountain, Jr. | |

It is certified that error appears in the above-identified patent and that said Letters Patent is hereby corrected as shown below:

In the Specification

Column 6, Line 14, delete "FIG." and insert --FIGS.--.

Column 7, Line 52, delete "that" and insert --than--.

Column 9, Line 37, delete "that" and insert --than--.

Signed and Sealed this
Tenth Day of February, 2026

John A. Squires
*Director of the United States Patent and Trademark Office*